United States Patent [19]
Kyomasu et al.

[11] Patent Number: 5,410,175
[45] Date of Patent: Apr. 25, 1995

[54] MONOLITHIC IC HAVING PIN PHOTODIODE AND AN ELECTRICALLY ACTIVE ELEMENT ACCOMMODATED ON THE SAME SEMI-CONDUCTOR SUBSTRATE

[75] Inventors: Mikio Kyomasu; Masanori Sahara; Kenichi Okajima; Hiroyasu Nakamura, all of Hamamatsu, Japan

[73] Assignee: Hamamatsu Photonics K.K., Hamamatsu, Japan

[21] Appl. No.: 899,591

[22] Filed: Jun. 18, 1992

Related U.S. Application Data

[63] Continuation of Ser. No. 576,065, Aug. 31, 1990, abandoned.

[30] Foreign Application Priority Data

| Aug. 31, 1989 | [JP] | Japan | 1-226305 |
| Aug. 31, 1989 | [JP] | Japan | 1-226306 |
| Aug. 31, 1989 | [JP] | Japan | 1-226307 |
| Aug. 31, 1989 | [JP] | Japan | 1-226308 |
| Aug. 31, 1989 | [JP] | Japan | 1-226309 |
| Oct. 31, 1989 | [JP] | Japan | 1-284191 |
| Oct. 31, 1989 | [JP] | Japan | 1-284192 |

[51] Int. Cl.$^6$ .............................. H01L 27/14
[52] U.S. Cl. ...................... 257/458; 257/446; 257/514; 257/517
[58] Field of Search ............... 357/30 P, 30 G, 30 L, 357/34, 40, 43, 48, 50; 257/458, 446, 514, 517, 519

[56] References Cited

U.S. PATENT DOCUMENTS

| 4,523,215 | 6/1985 | Iwatani | 357/34 |
| 4,831,430 | 5/1989 | Umeji | 357/30 P |
| 4,947,231 | 8/1990 | Palara et al. | 357/34 |
| 4,984,053 | 1/1991 | Kayanuma | 357/50 |
| 5,086,326 | 2/1992 | Shinohara et al. | 357/34 |
| 5,107,320 | 4/1992 | Iranmanesh | 357/34 |

FOREIGN PATENT DOCUMENTS

| 0042218 | 12/1981 | European Pat. Off. | 357/30 P |
| 1-205564 | 8/1989 | Japan | 257/446 |
| 2-196463 | 8/1990 | Japan | 257/446 |

OTHER PUBLICATIONS

Cheng et al., "Monolithically Integrated Receiver Front End: $In_{0.53}Ga_{0.47}As$ p-i-n Amplifier," *IEEE Transactions on Electron Devices*, vol. 35, No. 9, Sep. 1988.

*Primary Examiner*—Andrew J. James
*Assistant Examiner*—Courtney A. Bowers
*Attorney, Agent, or Firm*—Cushman Darby & Cushman

[57] ABSTRACT

This invention relates to a monolithic IC having a PIN photodiode and an n-p-n bipolar transistor formed on a single semiconductor (silicon) substrate. In fabricating such IC, it is important to electrically isolate the photodiode and the bipolar transistor. In addition it is necessary to make the surface of the substrate flat. According to this invention, the inter-device isolation between the above-described two devices is attained by forming two epitaxial layers on the silicon substrate, forming trenches in the layers, and burying silicon dioxide in the trenches. In the monolithic IC according to this invention wiring capacity is small, and high-speed performance becomes possible. A p-type buried-layer is formed below the bipolar transistor to thereby prevent punch through between the bipolar transistor and other devices. Also this invention provides the process for fabricating a planar type bipolar transistor suitable to fabricate the monolithic IC and also provides a PIN photodiode of a new structure.

9 Claims, 24 Drawing Sheets

MONOLITHIC IC HAVING PIN PHOTODIODE AND AN ELECTRICALLY ACTIVE ELEMENT ACCOMMODATED ON THE SAME SEMI-CONDUCTOR SUBSTRATE

This is a continuation of Application No. 07/576,065, filed on Aug. 31, 1990, which was abandoned upon the filing hereof.

BACKGROUND OF THE INVENTION

1. Field of the Invention

This invention relates to a semiconductor device, specifically to a PIN photodiode, a bipolar transistor and an integrated circuit (IC) of an electronically active element such as an n-p-n bipolar transistor and PIN photo-diode.

2. Related Background Art

As a photoelectric conversion device, the PIN photodiode is known, and there have been proposed various techniques for its integration with other devices, e.g., a bipolar transistor, on the same substrate. For example, Japanese Patent Laid-Open (JPO) Nos. 62-123783 and 63-93174 relating to K. Ogawa invention discloses the technique for providing a dielectric film between a silicon crystal layer and a silicon substrate for electric isolation. JPO No. 62-158373 relating to K. D. Moyer invention discloses the technique for thinning that portion of a silicon substrate in a region where a silicon photodiode is formed for decreasing the leakage current. A technique 25 equivalent to Moyer technique is disclosed also in JPO No. 62-18075 relating to Y. Hayashi invention. Furthermore, JPO No.63-19882 relating to T. Ito invention discloses the technique for thinning that portion of a silicon substrate in a region where a photodiode is formed and electrically isolating the photodiode and a transistor by a p-n junction with a reverse-bias voltage applied to. JPO No. 62-16568 relating to M. Yamamoto invention discloses the technique for enclosing a photodiode with a dielectric layer for its isolation from other devices, e.g., a transistor.

But, in these techniques, the step of forming an isolation layer is complicated, and adversely high costs are their problem. Another problem is that the isolation layer is thick, and the integration efficiency of devices falls. When the integration efficiency lowers, wiring, such as aluminum, becomes longer which results in a problem that parasitic capacitance increases unsuitably for high-speed operation.

A first object of this invention is to provide a semiconductor device having a photodiode and an electronically active element such as a bipolar transistor integrated monolithically on the same substrate, and also has high-speed performance.

A second object of this invention is to provide a process for producing a bipolar transistor which can be efficiently isolated from other devices.

A third object of this invention is to provide a photodiode having high-speed performance.

SUMMARY OF THE INVENTION

This invention relates to a semiconductor device comprising a heavily doped p-type semiconductor substrate, a lightly doped p-type epitaxial layer formed on the substrate, and an n-type epitaxial layer formed on the p-type epitaxial layer, a doped n-type layer formed in the surface of a required region of the lightly doped p-type epitaxial layer, the heavily doped p-type semiconductor substrate serving as the P layer, the lightly doped p-type epitaxial layer serving as the I layer, and the n-type buried-layer serving as the N layer constituting a PIN photodiode;
and a p-type base layer and an n-type emitter layer formed by doping impurities in that portion of the n-type epitaxial layer near said required region, and an n-type collector layer provided by the n-type epitaxial layer per se constituting an electronically active element such as an npn bipolar transistor.

This invention also relates to a process for fabricating a planar type bipolar transistor of the structure in which all the emitter electrode, base electrode and collector electrode are provided on a silicon substrate, the process comprising the step of forming shallow trenches in a region for isolating a base layer and a collector electrode layer, and in an inter-device isolation region; the step of etching the shallow trenches in the inter-device isolation region deeper; the step of oxidizing the inside surface of the shallow trenches and the deeper trench to form an oxide film in each of the trenches in substantially the same width as the depth of the shallow trench; and the step of burying polysilicon in the deeper trenches.

Furthermore this invention relates to a PIN photodiode comprising a heavily doped first conductive type semiconductor substrate; a lightly doped first conductive type epitaxial layer, a second conductive type buried-layer formed in the surface of a required region of the lightly doped first conductive type epitaxial layer, and a p-type doped layer formed in such a manner as to enclose the second conductive type buried-layer; and an anode provided by the underside of the heavily doped first conductive type semiconductor substrate, a cathode provided by the second conductive type buried-layer, and the I layer provided by the lightly doped first conductive type epitaxial layer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
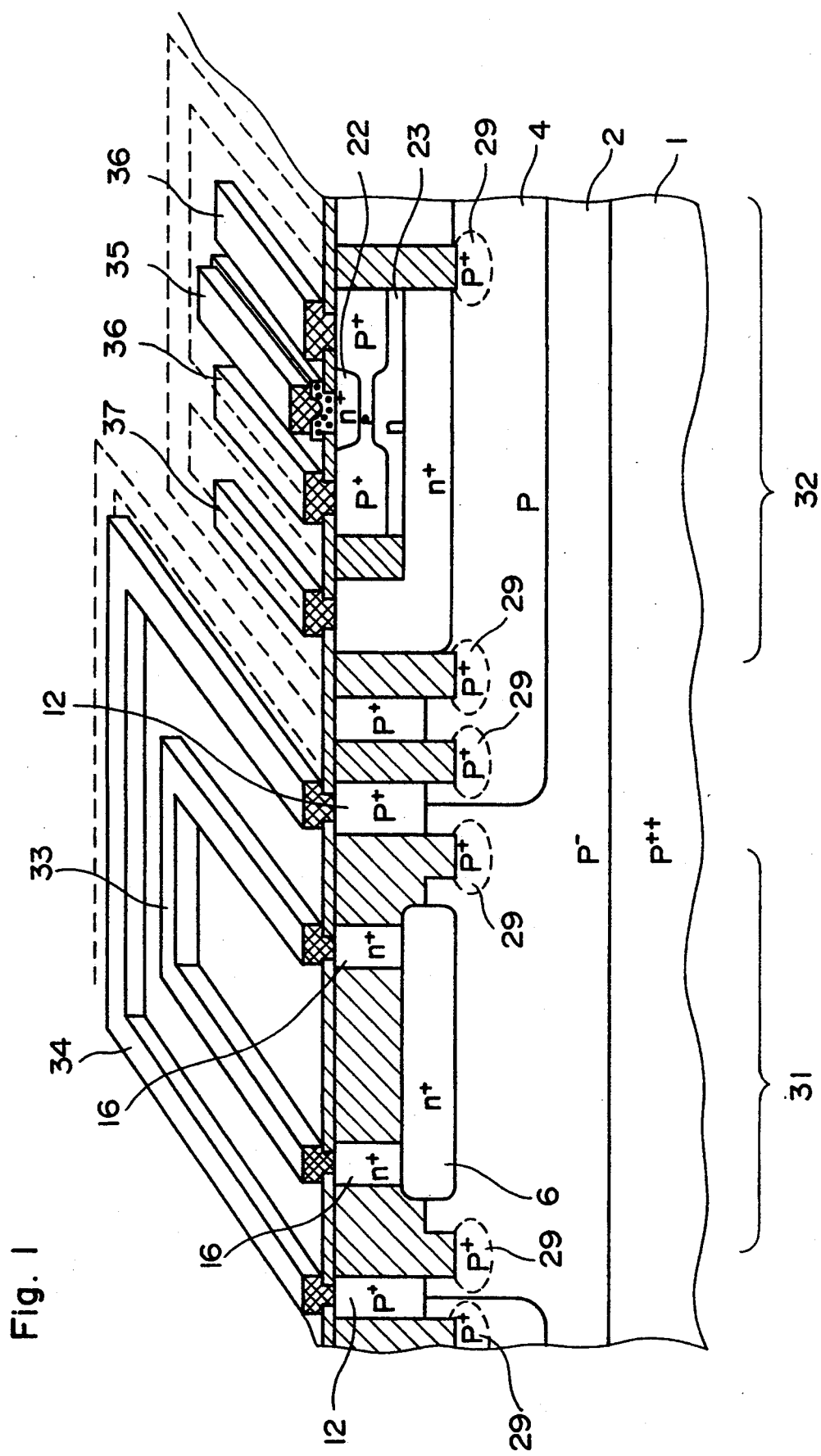
FIG. 1 is a perspective view of a section of the monolithic IC according to one embodiment of this invention.

The monolithic IC according to one embodiment of this invention shown in FIG. 1 has the following characteristics. A first characteristic is that a two-layer structure of a lightly doped p$^-$-type epitaxial layer 2 and an n-type epitaxial layer is formed on a heavily doped p$^{++}$-type silicon substrate. This structure allows a PIN photodiode 31 and an npn bipolar transistor 32 as one example of an electronically active element to be accommodated on the same substrate. A second characteristic is that the npn bipolar transistor as one example of an electronically active element is formed on the p$^-$-epitaxial layer 2 serving as the I layer of the PIN photodiode 31, and a p-type well buried-layer 4 is formed between the epitaxial layer 2 and the transistor 32. This arrangement prevents the punch through between the npn bipolar transistor and a neighboring transistor not shown. In FIG. 1, the p-well buried-layer 4 is formed on the entire underside of the npn bipolar transistor 32, and the collector capacitance becomes large, but the resistance to the substrate 1 becomes low. In contrast to this, as in FIG. 4, a p-type buried-layer 41 is formed on the periphery of the underside of the npn bipolar transistor 32, and the collector capacitance becomes smaller, but the resistance to the substrate becomes higher. A third characteristic is that an electrode layer 16 for the PIN photodiode is formed using the n-type epitaxial layer. An oxide film (hatched) formed by oxidizing the surrounding n-epitaxial layer is substantially in the same plane as the electrode layer 16. This allows the surface to be planar.

Figure 2A:
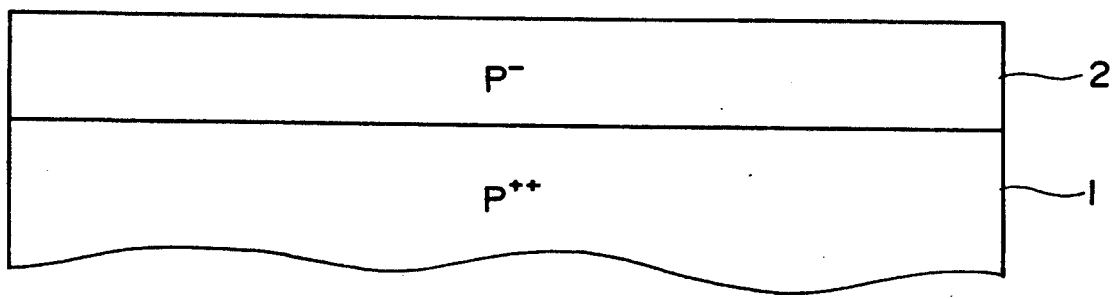
FIGS. 2A to 2N are sectional views of the process for fabricating the monolithic IC of FIG. 1.
Figure 2B:
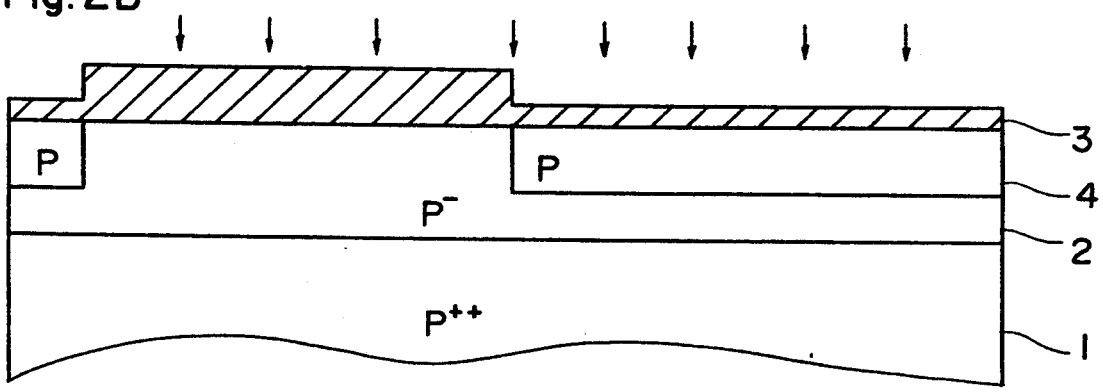
Figure 2C:
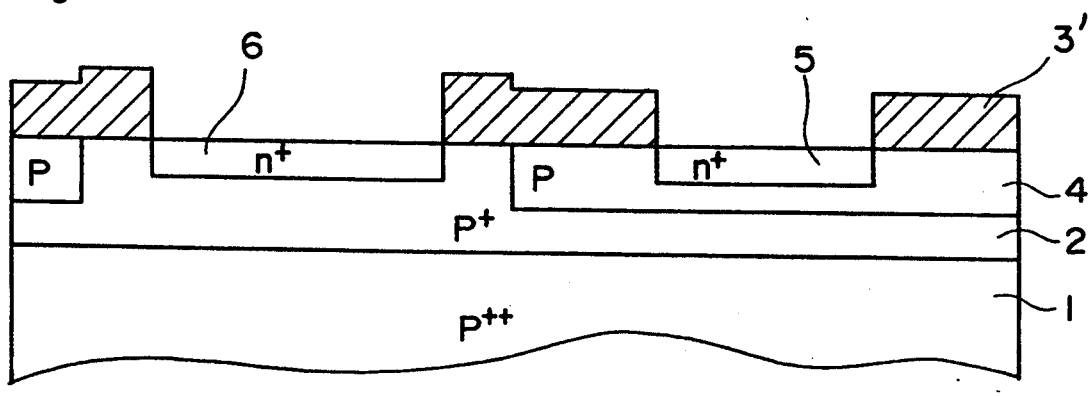
Figure 2D:
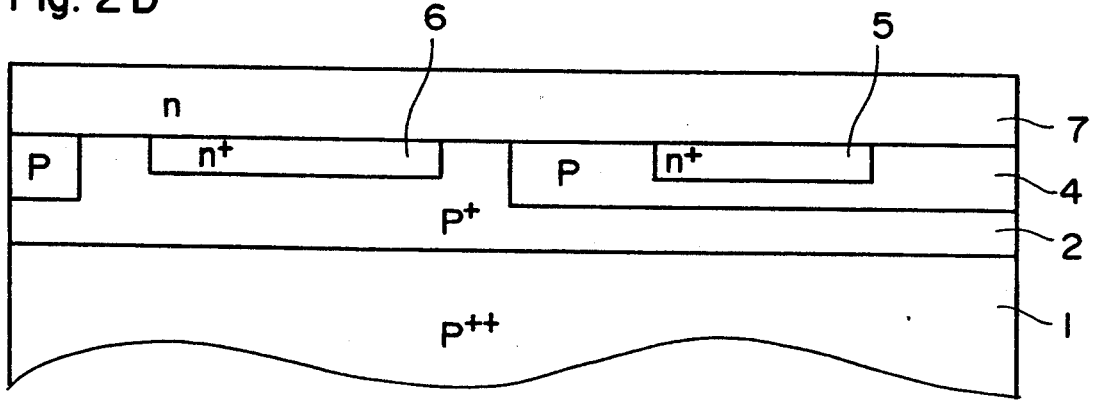
Figure 2E:
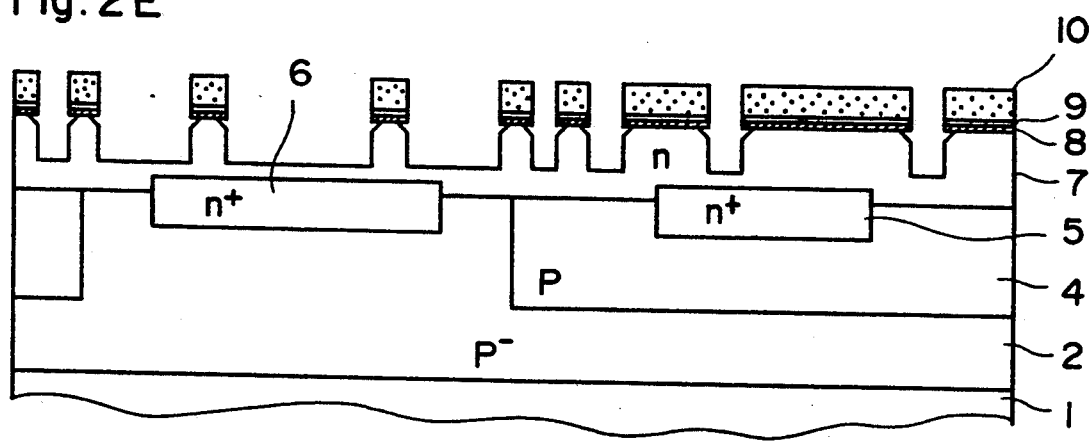
Figure 2F:
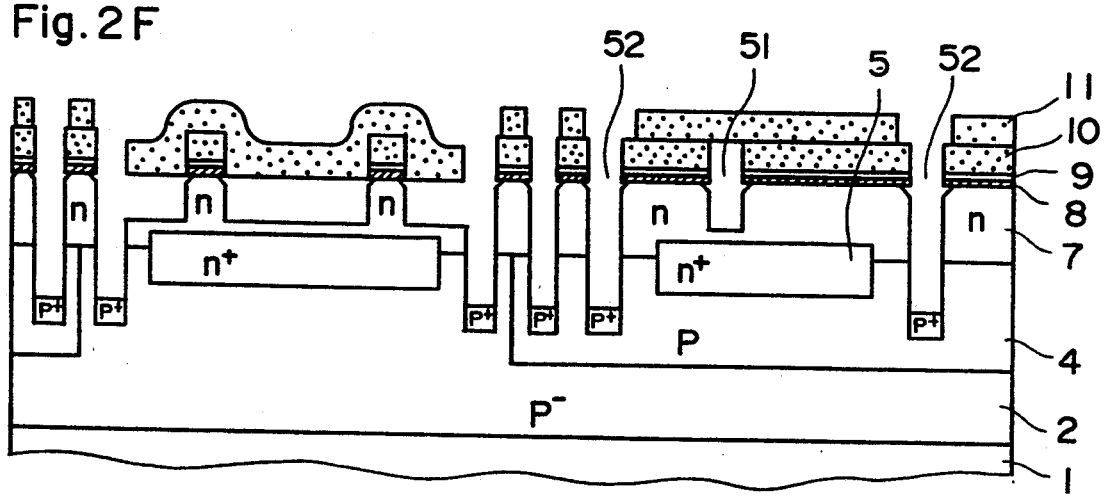
Figure 2G:
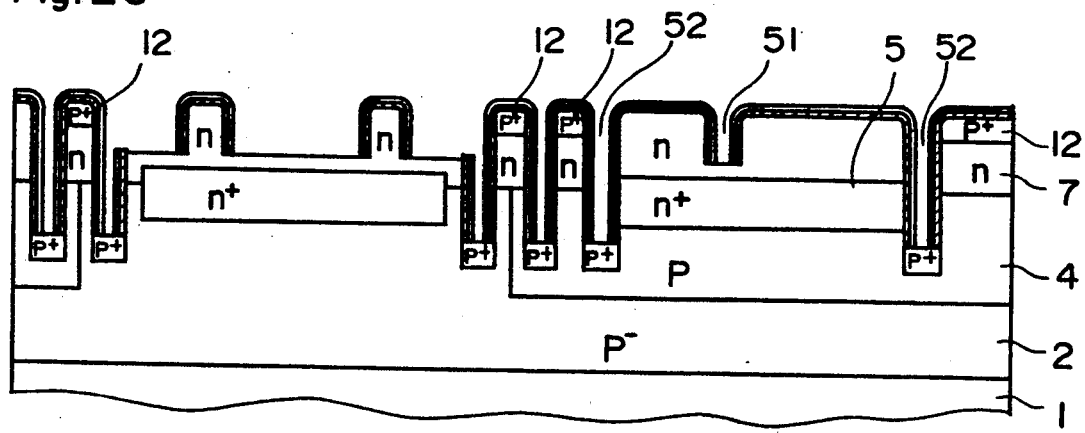
Figure 2H:
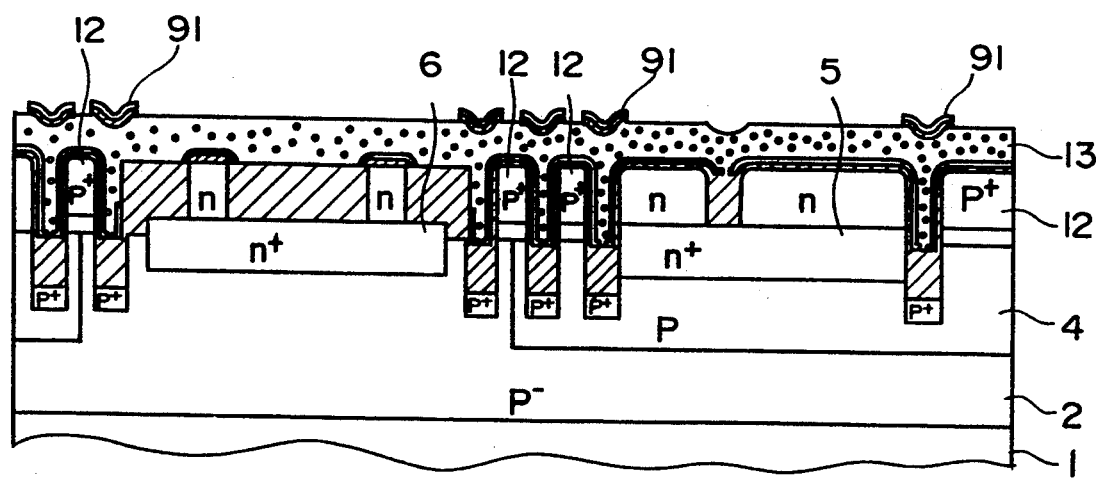

Next, with reference to FIGS. 2A to 2N, the process for fabricating the semiconductor device of FIG. 1 will be explained. The lightly doped p-type epitaxial layer 2 with a dopant concentration of $10^{12}$ to $10^{14}$ atoms/cm$^3$ is formed on the heavily doped p-type semiconductor (silicon) substrate 1 with a dopant concentration of $10^{20}$ to $10^{21}$ atoms/cm$^3$ in a thickness of 30 to 50 μm (FIG. 2A). Although not shown, a SiO$_2$ film is formed on the underside of the substrate 1 for the prevention of auto doping. The SiO$_2$ film 3 is formed on the surface of the epitaxial layer 2, and the epitaxial layer 3 is processed by the lithography. With the SiO$_2$ film used as the mask, boron (B) ions are implanted to form the p-type well buried-layer 4 for the npn bipolar transistor. The dopant concentration of the buried-layer 4 is around $10^{15}$ to $10^{16}$ atoms/cm$^3$ (FIG. 2B). As seen from the position of the p-type well buried-layer 4, the substantially right half is the region for the npn bipolar transistor to be formed in, and the substantially left half is the region for the PIN photodiode to be formed in.

Figure 3:
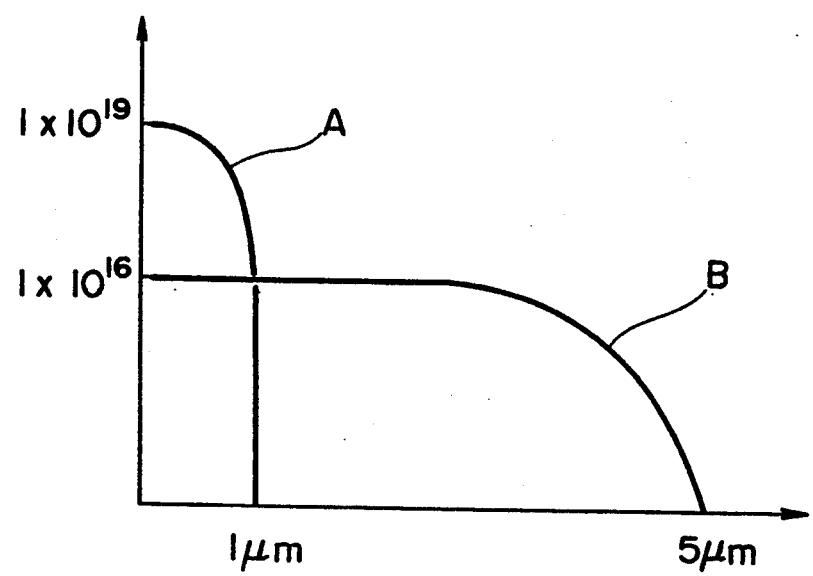
FIG. 3 is a view o,f profiles of antimony and boron.

Then the SiO$_2$ film is deposited, and this SiO$_2$ film is processed by the photolithograph, and with the processed SiO$_2$ film 3' as the mask, antimony (Sb) is thermally diffused to thereby form an n-type buried layer 5 for the npn transistor, and the n-type buried-layer 6 for the PIN photodiode. The dopant concentrations of the n-type buried-layers are around $10^{19}$ to $10^{20}$ atoms/cm$^3$ (FIG. 2C). FIG. 3 shows the dopant profiles of the buried-layers 4 to 6. Curve A indicates the profile of the antimony, and Curve B indicates that of the boron. Then the SiO$_2$ film 3' is removed to form a lightly doped n-type epitaxial layer 7 in a thickness of 2±0.2 μm. The dopant concentration of the n-type epitaxial layer 7 is around $10^{15}$ to $10^{16}$ atoms/cm$^3$ (FIG. 2D). Thus, the burying and diffusing steps and the epitaxial growth step are completed.

Subsequently the isolation process will be explained. A SiO$_2$ film 8 and a SiN film 9 are formed on the entire surface of the n-epitaxial layer 7. Onto the films a resist is applied to form a resist film. Those portions of the resist film in required regions are removed by the lithography to form a patterned resist film 10. With this resist film 10 as the mask, the SiO$_2$ film 8 and the SiN film 9 are etched off. Then, with the SiO$_2$ film 8 and the SiN film 9 as the mask, the n-epitaxial layer 7 is dry-etched down to a depth of 0.1 μm from the surface, and further anisotolopic dry-etched down to a depth of 0.7 μm to form shallow trenches (FIG. 2E). The above-described required regions are for the isolation regions for the npn transistor, the isolation region between a p-type base layer and a collector wall which will be formed within the npn transistor in following steps, the light receiving region of the PIN photodiode, etc.

Then a resist is applied anew to form a resist film in addition to the above-described resist film 10. That of the newly-formed resist film on the trenches in the isolation regions is removed to form a patterned resist film 11. With the SiO$_2$ film 8 and the SiN film 9, and the resist films 10, 11 as the mask, those shallow trenches in the inter-device isolation regions are anisotolopic dry-etched deeper to a depth of around 3.0 μm. Then, with the resist film 11 left, boron ions are implanted to form p$^+$-type stopper layers on the bottoms of the respective deeper trenches (FIG. 2F). In FIG. 2F, the trench indicated bey reference numeral 51 is the shallow trench for the inter-layer isolation in the bipolar transistor, and the trenches represented by reference numeral 52 are the deeper trenches for the inter-device isolation for isolating the bipolar transistor from another. Then after the resist films 10, 11 are removed, a resist is again applied, and a new resist pattern is formed by the lithography (not shown). With this resist film as the mask, boron ions are implanted to form p$^+$-type tabs 12. The p$^+$-type tabs 12 are formed in such a manner as to enclose the PIN photodiode region and the npn transistor region. Then, this resist is removed to form a SiO$_2$ film and a SiN film on the inside surface of each of the trenches. The SiN film is anisotolopic etched to remove that portion of the SiN film on the bottom of each trench with that portion of the SiN film on the side wall of each trench left (FIG. 2G).

Subsequently thermal oxidation is conducted in the ambient atmosphere of 6 atoms and at 1050° C. That portion of the silicon which is not covered with the SiN film is oxidized. The resultant oxide film has a thickness of around 1.5 μm which substantially fully fills the shallow trench as hatched in FIG. 2H. Then, a polysilicon layer 13 is deposited on the entire surface to bury also the deeper trenches. Next, a SiO₂ film and a SiN film are formed on the surface of the polysilicon layer 13, and patterning is conducted so that patterns 91 are left only on the, tops of the deeper trenches by dry etching (FIG. 2H). Then the polysilicon layer 13 is etched, so that the polysilicon remains only inside the deeper trenches. Next, the portions of the SiN film left on the surface of the patterns 91 are dry etched off, and then the surface is planarized by thermal oxidation (FIG. 2I).

Subsequently, after the SiO₂ on the surface is removed, a SiO₂ film 26 and a SiN film 27 are formed on the entire surface. Patterning is conducted by the lithography in required regions of the SiO₂ film 26 and the SiN film 27. With the remaining SiO₂ film 26 and SiN film as the mask, phosphorus is thermally diffused to form an n⁺-layer 15 which will become the collector wall of the npn transistor, and an n⁺-layer 16 which will become the electrode layer of the PIN photodiode (FIG. 2J). In FIGS. 2J to 2M, the polysilicon and the SiN film in the deeper trenches are not shown for simplicity. Then after the opening of the SiN film 27 is oxidized, a mask 17 is formed on the emitter region, and boron ions are implanted to form external bases 18 (FIG. 2K). Another mask (not shown) is formed by the lithography, and boron ions are implanted to form an intrinsic base 19. Then, a SiO₂ film 20 is formed by the chemical vapor deposition (CVD) and is heated to form the profile (FIG. 2L).

Next, after the SiO₂ film 20 and the SiN film are dry-etched off, polysilicon 21 is deposited, and arsenic ions are implanted (FIG. 2M),. Then a SiO₂ film is formed by CVD and heated to form an emitter 22. A collector 23 is provided by the n-epitaxial layer remaining on the underside of the base 19. Then the SiO₂ film and the unnecessary polysilicon are dry-etched off, and again a SiO₂ film is formed by CVD (FIG. 2N).

The semiconductor device of FIG. 1 is prepared by following the above-described steps to form the necessary electrodes, and includes the PIN photodiode 31 and the npn transistor 32 formed monolithically on the same substrate. The PIN photodiode 31 is a substrate-type PIN silicon photodiode having the heavily doped p-type substrate 1 serving as the P layer, the lightly doped p-type epitaxial layer 2 serving as the I layer, and the n-type buried-layer 6 serving as the N layer. A cathode 33 is connected to the n-type buried-layer 6 through the electrode layer 16. An anode not shown is provided on the underside of the substrate 1. When a beam is incident with a reverse bias voltage applied between these electrodes, carriers are generated in the depletion region of the lightly doped p-epitaxial layer 2, and pairs of electrons and holes move because of the electric field of the depletion region to generate a photocurrent. The electrode 34 on a p⁺tab layer 12 functions as the anode of the PIN photodiode together with the anode on the underside. The addition of this electrode 34 as the anode can further decrease parasitic resistance than if the electrode on the underside alone provides the anode.

As shown, the npn transistor 32 has an emitter electrode 35, a base electrode 38 and a collector electrode 37. The p-buried layer is provided for the prevention of punch through with respect to the surrounding devices. The stopper layers 29 provided around the bottoms of the isolation trenches further secure the prevention of the punch through. This semiconductor device, which includes the PIN photodiode and the npn bipolar transistor formed monolithically on the same substrate, has advantageous effects that the parasitic capacitance due to wiring can be reduced, etc. In using this semiconductor device in the receiver circuit or others for the optical communication, it is possible that the circuit can perform at higher speed than the conventional circuit. It is also possible to omit the incorporating step as required for the hybrid IC.

In the PIN photodiode 31, the electrode layer 16 is formed in the same plane as the surface of the npn transistor 32 by using the n-epitaxial layer 7. On the periphery of the electrode layer 16 the silicon oxide layer (hatched) formed by oxidizing the n-epitaxial layer 7 is formed in the same plane as the electrode layer 16. Thus, the entire surface containing the PIN photodiode 31 and the npn transistor 32 is planarized, which facilitates aluminum wiring.

In this embodiment, in the central region which is the light receiving region of the PIN photodiode 31, the surface of the SiO₂ film is also in the same plane as the electrode layer 16. That is, the thickness of the SiO₂ film is around 2 μm. But the film thickness in this region is determined, rather taking into consideration of the wavelength of the beam to be received. For the photodiode for the infrared radiation within the wavelength range of 800 to 900 nm, the SiO₂ film may be as thick as 2 μm. But for the photodiode for the wavelength range of the ultraviolet radiation, it is preferable that the SiO₂ film is as thick as around 0.2 μm. In this semiconductor device, the PIN photodiode and the npn bipolar transistor are formed monolithically on the same substrate, and, in addition, the surface is planar, which facilitates the following wiring.

Figure 4:
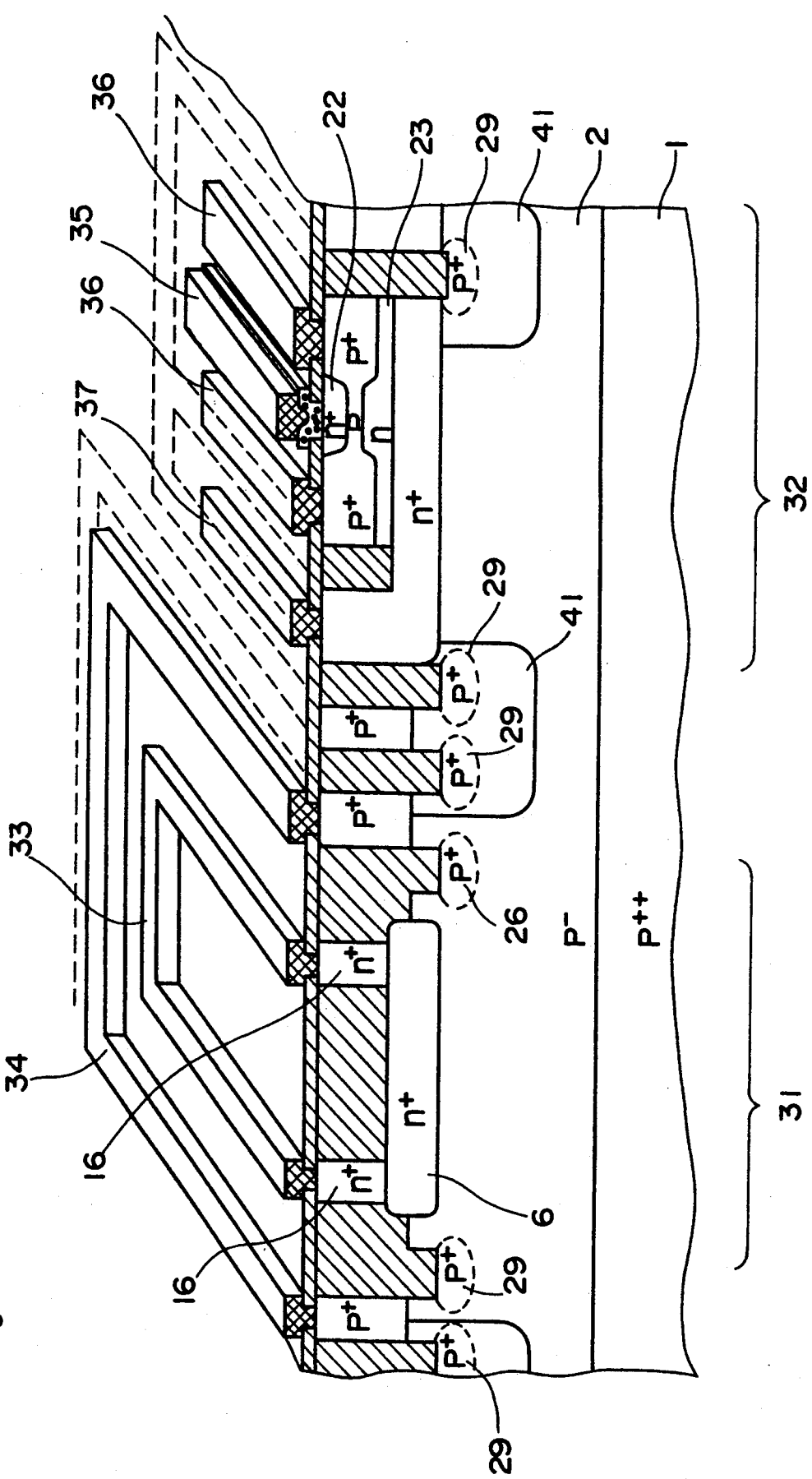
FIG. 4 is a perspective view of a section of the monolithic IC according to another embodiment of this invention.

In this embodiment, the p-type buried-layer 4 is formed in the region which is extended all over the underside of the npn transistor BE, but as shown in FIG. 4, the p-type buried-layer 41 may be formed in such a manner as to enclose the npn transistor 32. The p-type buried-layer 4 of FIG. 1 adversely increases the collector capacitance comparatively but has the advantage that the resistance to the substrate becomes low. On the other hand, the p-type buried-layer 41 of FIG. 4 can decrease the, collector capacitance but adversely increases the resistance to the substrate. For example, in the former, the collector capacitance is 0.288 pF, and the resistance is 0.3 Ω, and in the latter, the collector capacitance is 0.09 pF, and the resistance is 330 Ω. It is preferable to select either of these p-type buried-layers, depending on uses.

Figure 2:
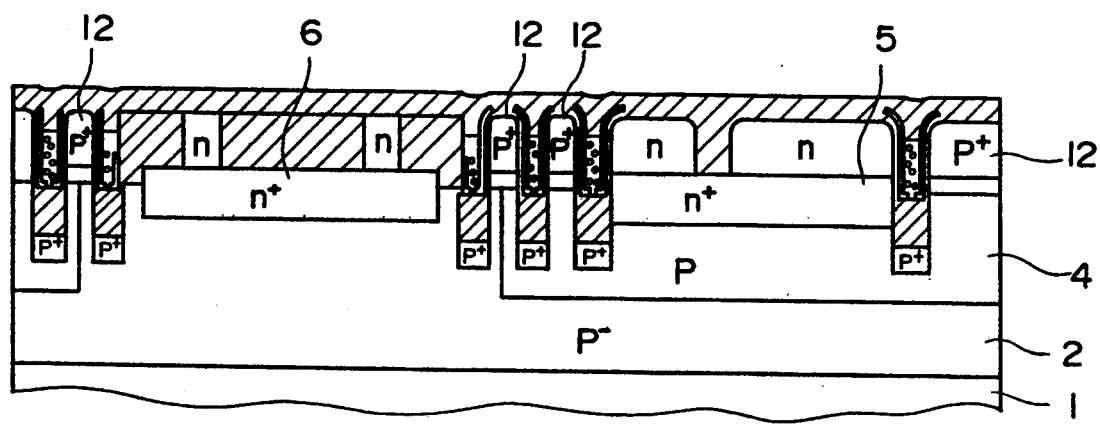
Figure 2:
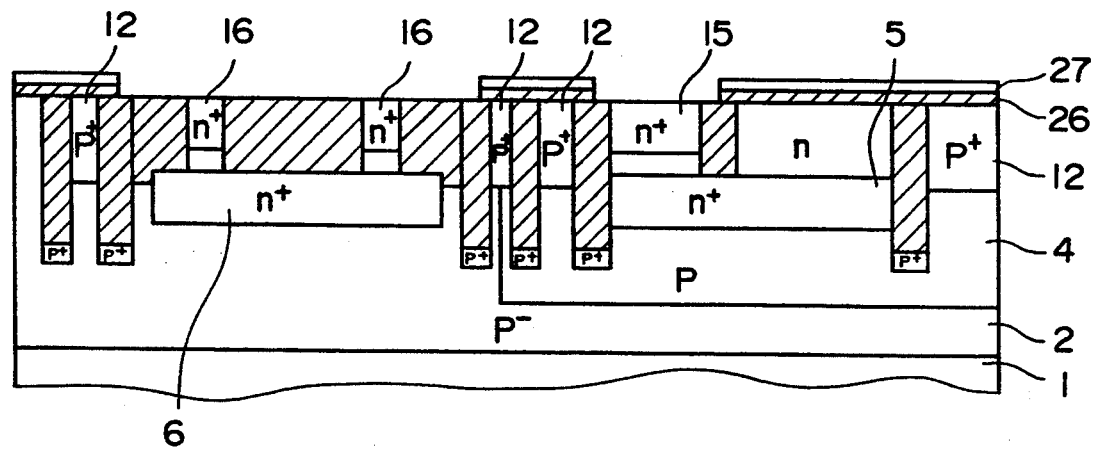
Figure 2K:
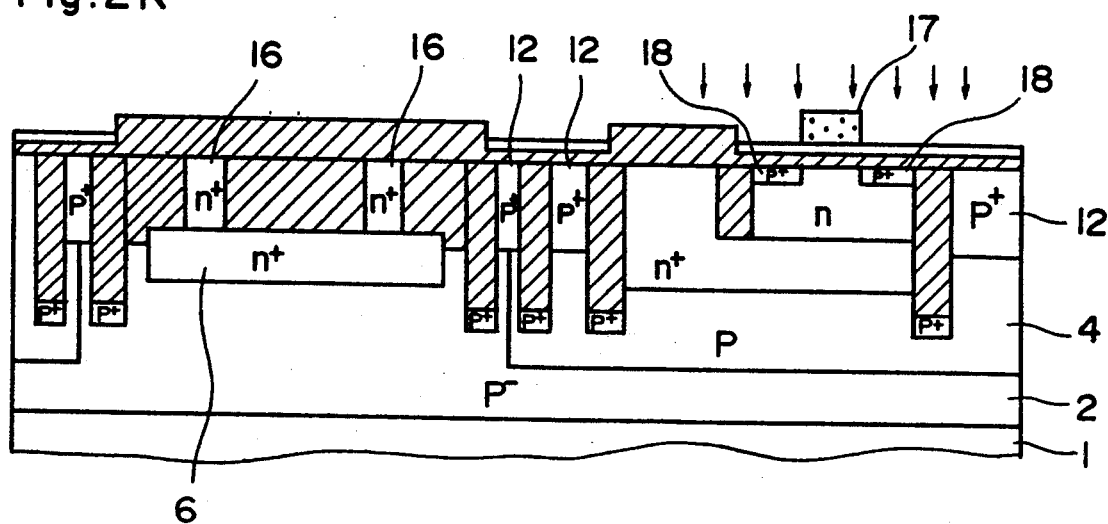
Figure 2L:
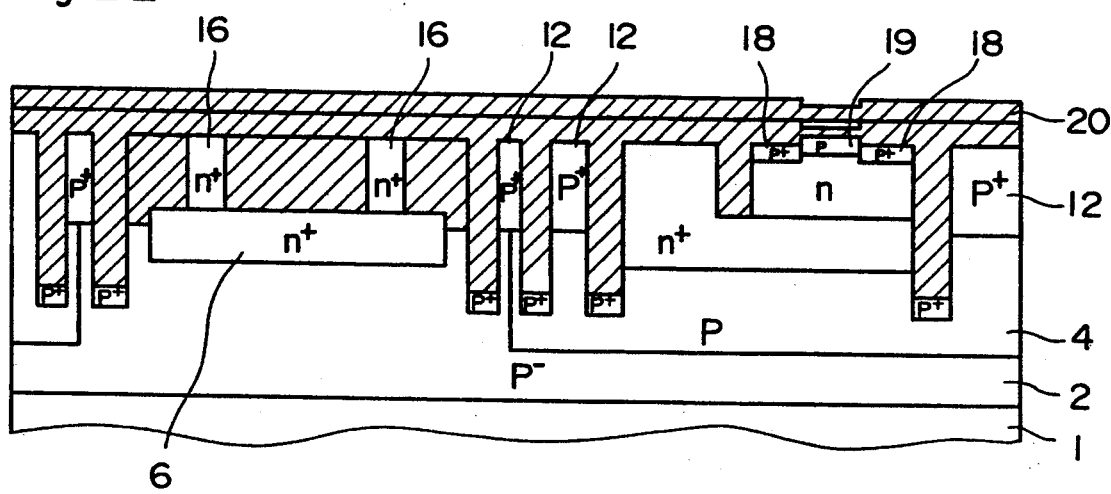
Figure 2M:
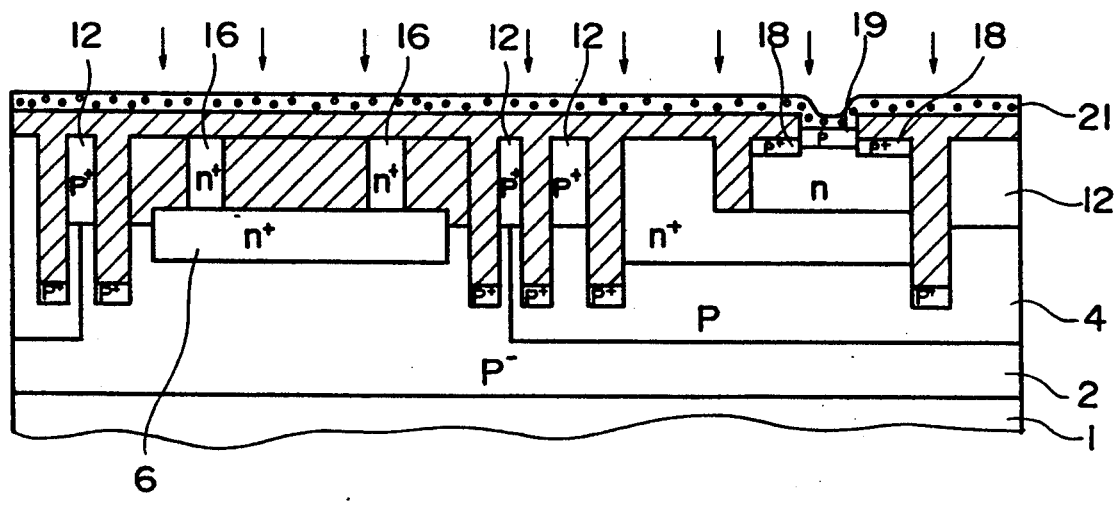
Figure 2N:
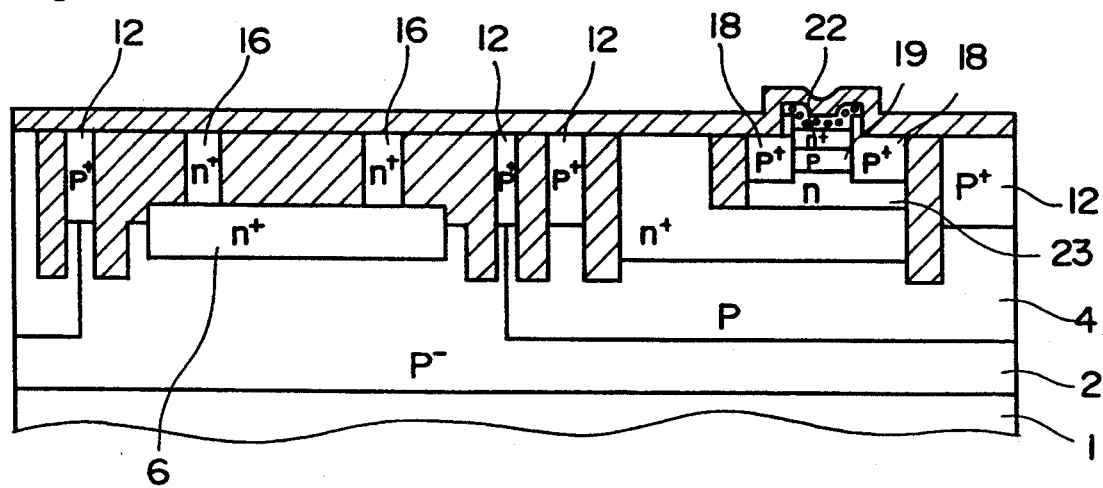

In the process for fabricating the bipolar transistor according to the embodiments of FIGS. 2 and 4, the step of forming trenches is used for the inter-layer isolation and the inter-device isolation, which makes it possible to narrow the isolation regions. As a result integration efficiency can be improved. The trenches for the inter-device isolation, which are deeper, are formed in two processing steps, and compared with one processing step, their geometry, etc. can be easily controlled. In addition, the first one of the two steps of forming the inter-layer isolation trenches is also for forming the inter-device isolation trench, and it is possible to form two kinds of isolation structures by a small number of steps.

The monolithic IC of FIG. 5 according to a different embodiment is different from that of FIG. 1 in the following points. That is, the silicon substrate 1 is of heavily doped n⁺⁺-type, and an n-type epitaxial layer 2 is formed on the substrate 1. This arrangement allows the PIN photodiode 31 and the npn bipolar transistor 32 to be accommodated on the same substrate. The p-type well buried-layer 4 and the cathode of the PIN photodiode 31 are connected by pn junction, and a reverse bias voltage is applied thereto to thereby isolate the PIN photodiode 31 and the npn bipolar transistor 32 by pn junction.

The process for fabricating the monolithic IC of FIG. 5 will be explained below with reference to FIGS. 6A to 6M. A lightly doped m-type epitaxial layer with a dopant concentration of $10^{12}$ to $10^{14}$ atoms/cm$^3$ is formed in a thickness of 30 to 50 μm on a heavily doped n-type silicon substrate 1 with a dopant concentration of $10^{20}$ to $10^{21}$ atoms/cm$^3$ (FIG. 6A). Then, on the surface a SiO$_2$ film 3 is formed and processed, and with this SiO$_2$ film 3' as the mask, boron ions are implanted to form a p-type well buried-layer 4 with a dopant concentration of around $10^{15}$ to $10^{16}$ atoms/cm$^3$ (FIG. 6B). With a SiO$_2$ film (not shown) having an opening in a region for the npn transistor to be formed in as the mask, antimony (Sb) ions are doped to form an n-type buried-layer 5 for the npn transistor. Next, a SiO$_2$ film with an opening in a region for the PIN photodiode to be formed in is formed. With this SiO$_2$ film as the mask, boron ions are doped, and a p-type buried-layer 6 for the PIN photodiode is formed (FIG. 6C). Subsequently, the SiO$_2$ film 3' is removed to form an n-type epitaxial layer 7 in a thickness of 2±0.2 μm. Its dopant concentration is around $10^{15}$ to $10^{16}$ atoms/cm$^3$ (FIG. 6D).

Figure 6A:
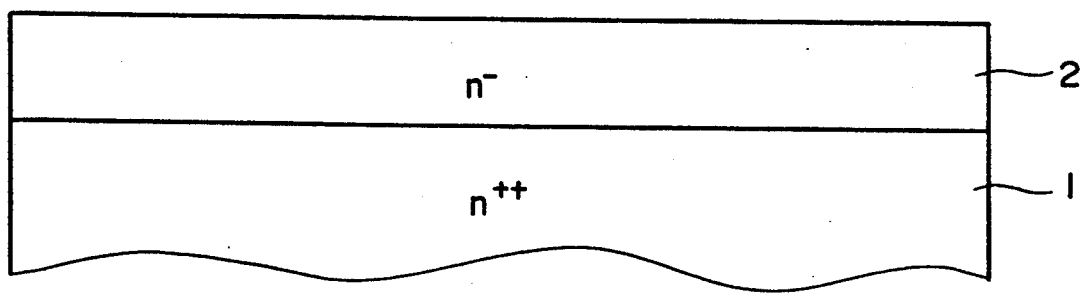
FIGS. 6A to 6M are sectional views of the process for fabricating the monolithic IC of FIG. 5.
Figure 6B:
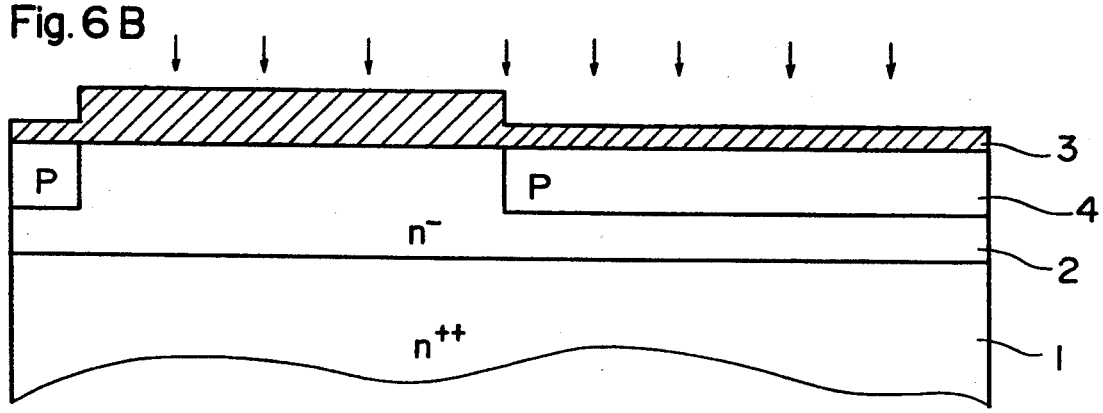
Figure 6C:
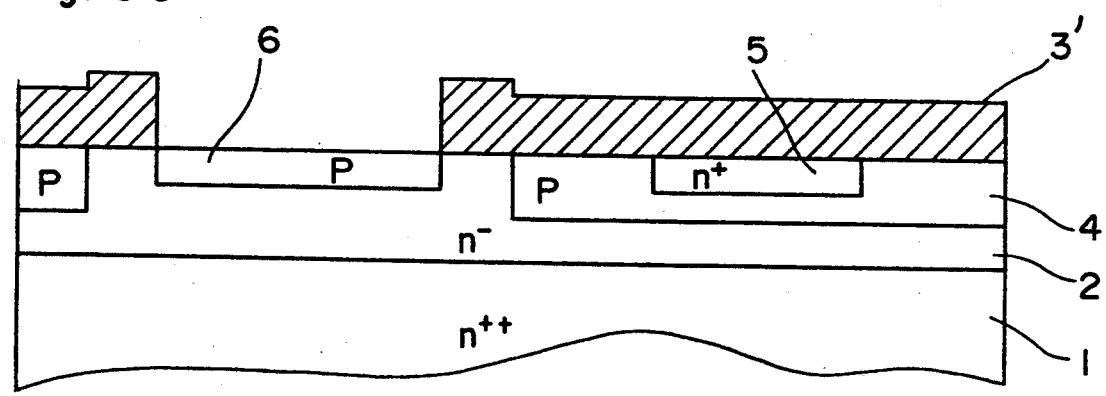
Figure 6D:
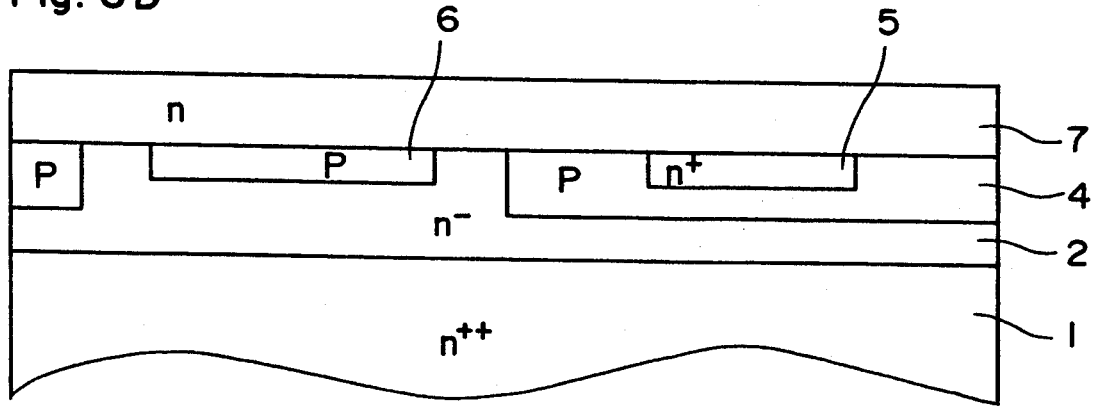
Figure 6E:
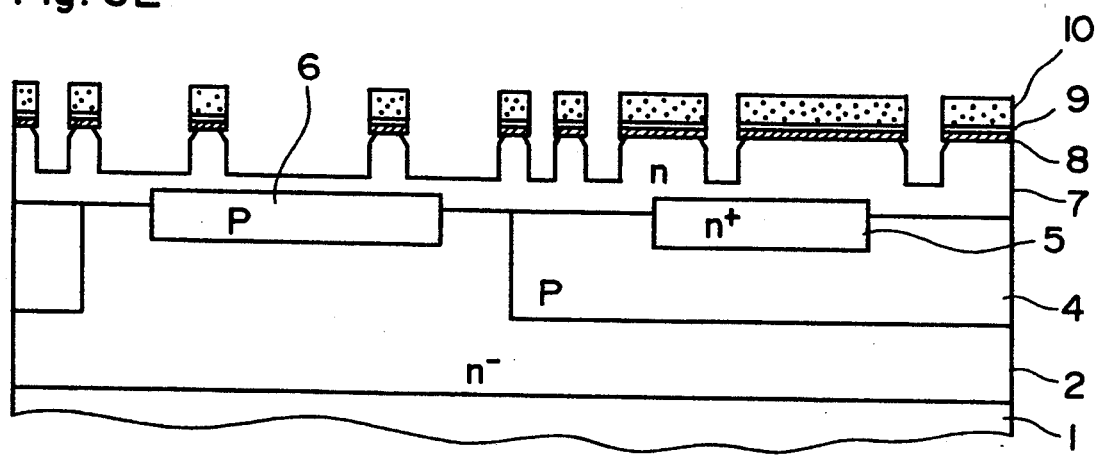

Then the isolation process will follow. A SiO$_2$ film 8 and a SiN film 9 are formed on the entire surface of the n-epitaxial layer 7 and are processed using a resist film 10. Then, with the processed SiO$_2$ and the SiN films 8, 9 as the mask, the n-epitaxial layer 7 is etched to form shallow trenches (FIG. 6E). The regions where the trenches are formed are the isolation region for the npn transistor, the region for isolating a p-type base layer and a collector wall which will be formed in following steps, and the light receiving region for the PIN photodiode.

Figure 6F:
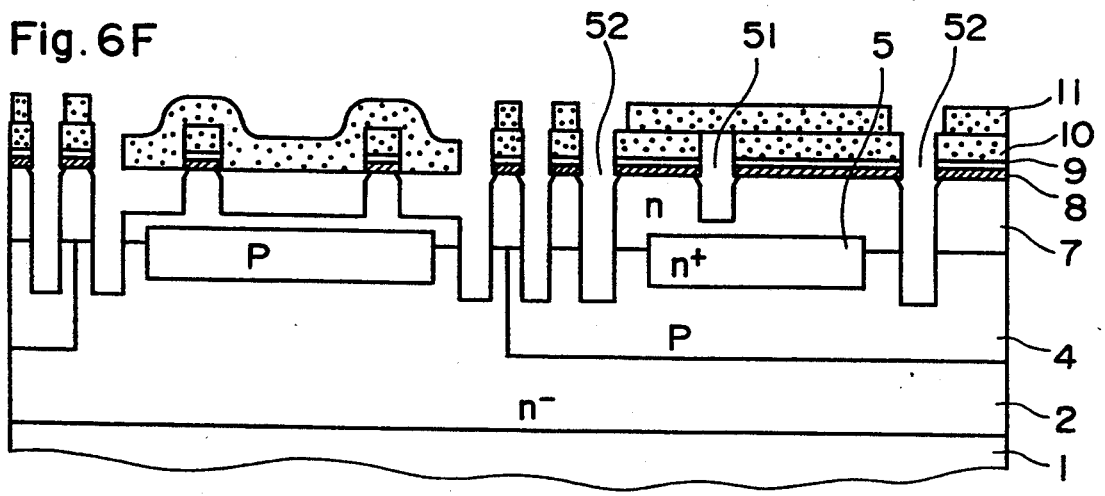
Figure 6:
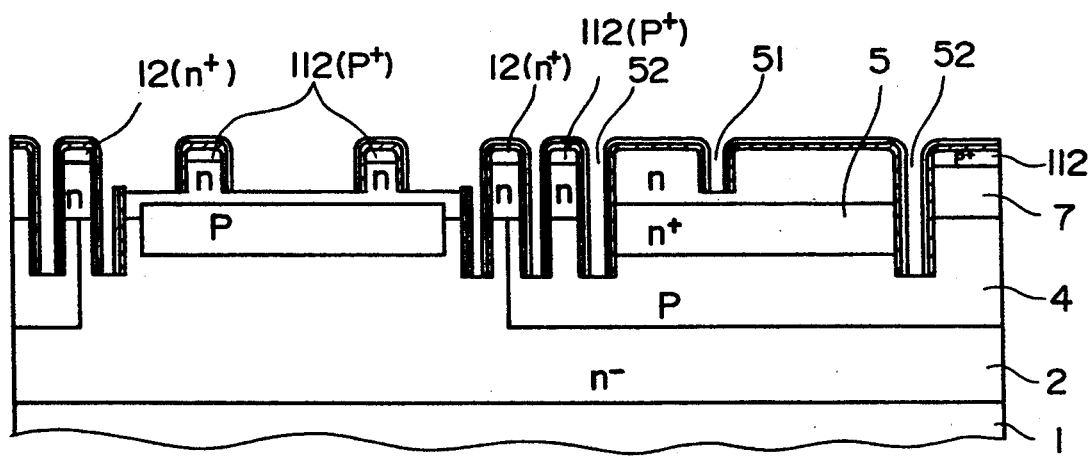
Figure 6:
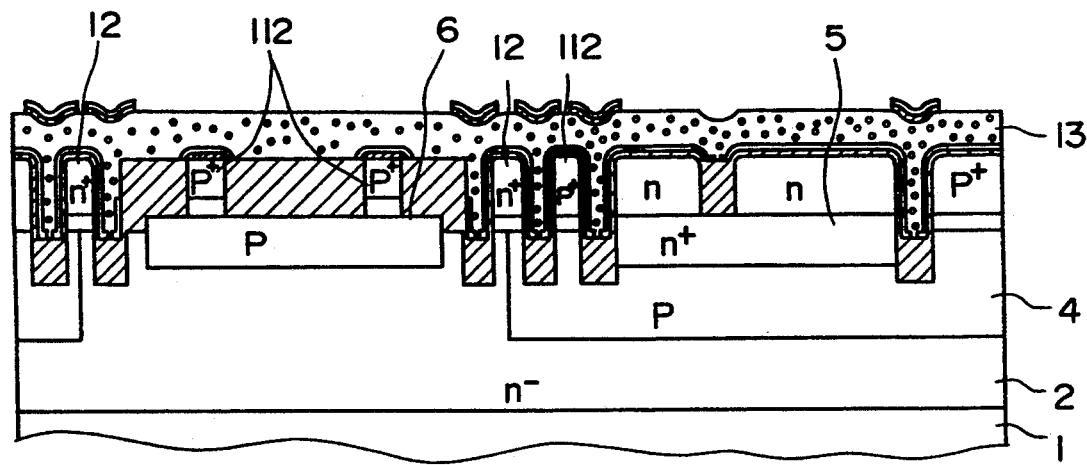
Figure 6:
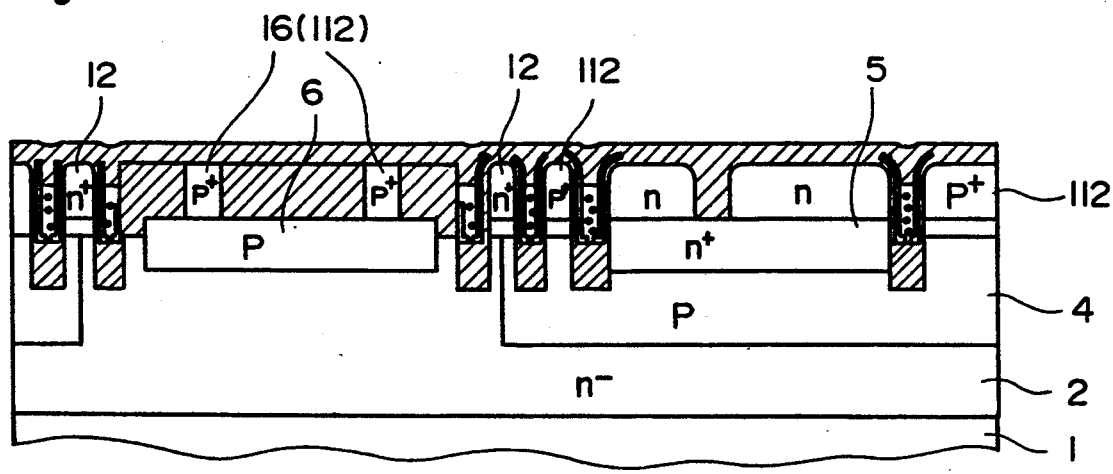
Figure 6:
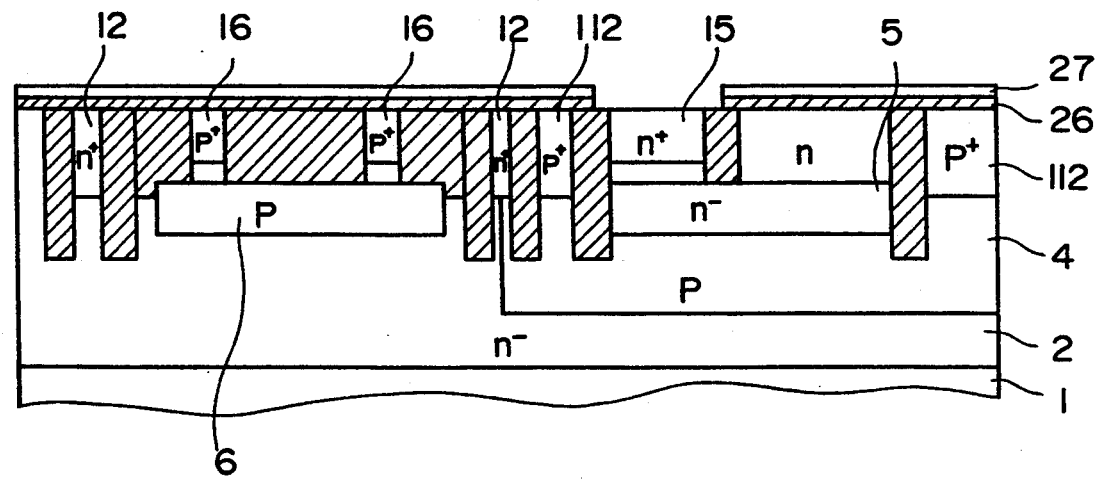

Next, a resist pattern 11 is formed, and with this resist pattern 11 as the mask, anisotolopic dry etching is conducted to deepen those of the shallow trenches in the isolation regions (FIG. 6F). Then another resist pattern (not shown) is formed to implant boron ions to form a p+-type tabs 112. This mask-forming step is repeated to implant antimony ions to form an n+-type tabs 12. These tabs 12, 112 are formed in such a manner as to enclose respectively the PIN photodiode region and the npn transistor region. Then the resist is removed to form a SiO$_2$ film and a SiN film on the inside surface of each of the trenches. With the SiN film on the side wall of each trench left, the SiN film on the bottom is removed (FIG. 6G).

Subsequently heat oxidation will follow. The portions which are not covered with the SiN film are oxidized to substantially fully fill the shallow trenches as shown by hatching. Then, on the entire surface polysilicon 13 is deposited to fill the deeper trenches. Next, a SiO$_2$ film and a SiN film are formed on the surface of the polysilicon 13, and patterning is conducted by dry etching so that the SiO$_2$ film will remain only on the top of the deeper trenches (FIG. 6H). Next, the polysilicon is etched, so that the polysilicon 13 remains only insides of the deeper trench. Then, the SiN film remaining on the surface is dry etched off, and the surface is planarized by oxidation. (FIG. 6I).

Subsequently a SiO$_2$ film 26 and a SiN film 27 are formed on the surface and processed. With the processed films as the mask, phosphorus is thermally diffused to form an n+-layer 15 which will be the collector wall of the npn transistor (FIG. 6J). Then boron ions are implanted to form external bases 18 and further an intrinsic base 19. Next a SiO$_2$ film 20 is formed by CVD and heated to form the profile.

Figure 6K:
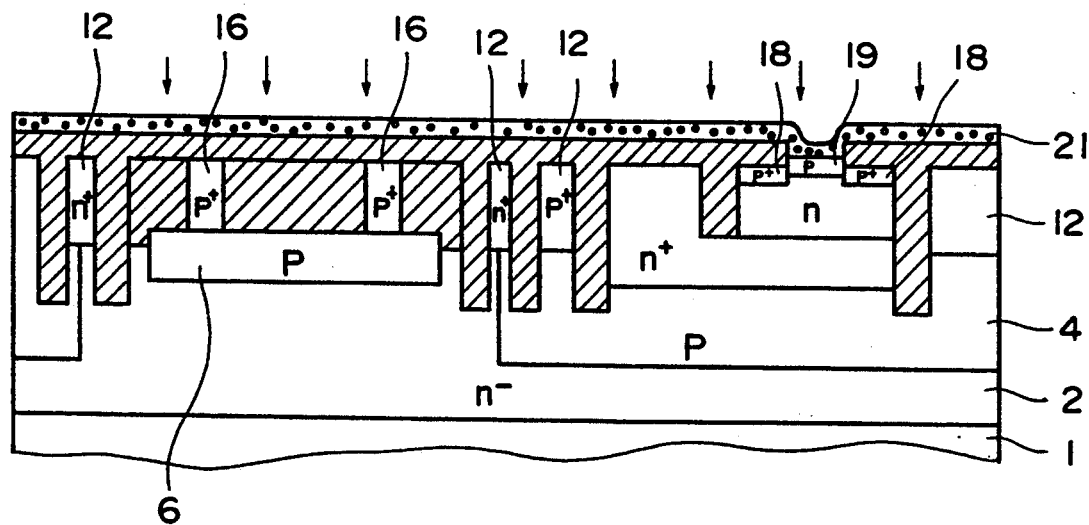
Figure 6L:
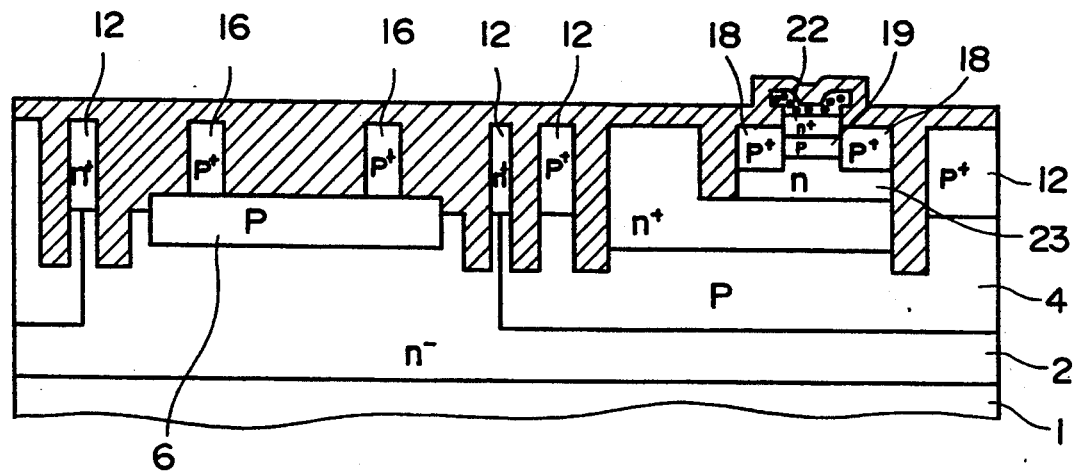
Figure 6M:
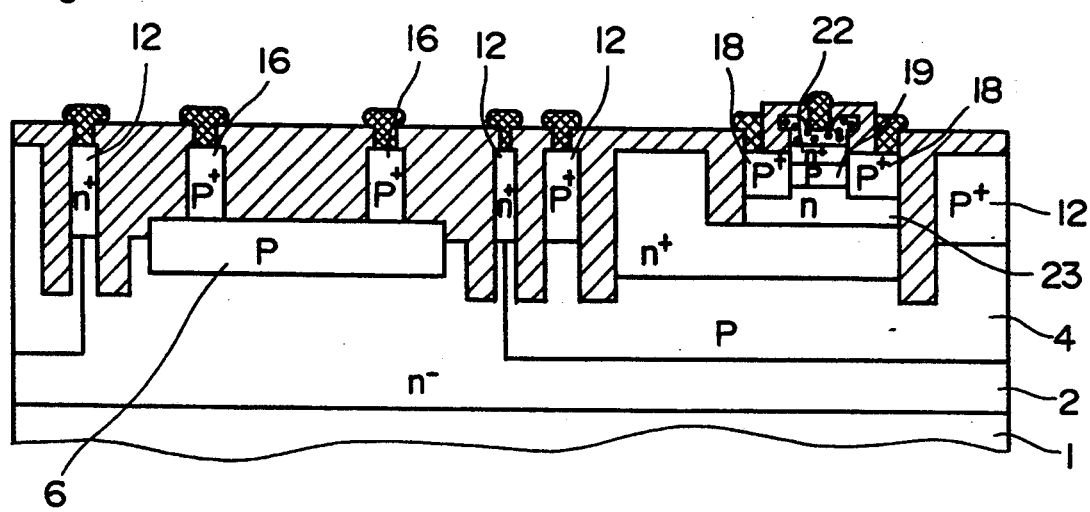

Subsequently, the SiO$_2$ Film and SiN film on the surface are dry etched, and then polysilicon 12 is deposited. Then arsenic ions are implanted (FIG. 6K). Next, a SiO$_2$ film is formed by CVD and heated to form an emitter 22. After the SiO$_2$ film and the unnecessary polysilicon are removed, a SiO$_2$ film is again formed by CVD (FIG. 6L). Then with a mask (not shown), the SiO$_2$ film is etched to form openings, and electrodes are formed in the openings as shown by the cross-hatching in FIG. 6M).

Figure 5:
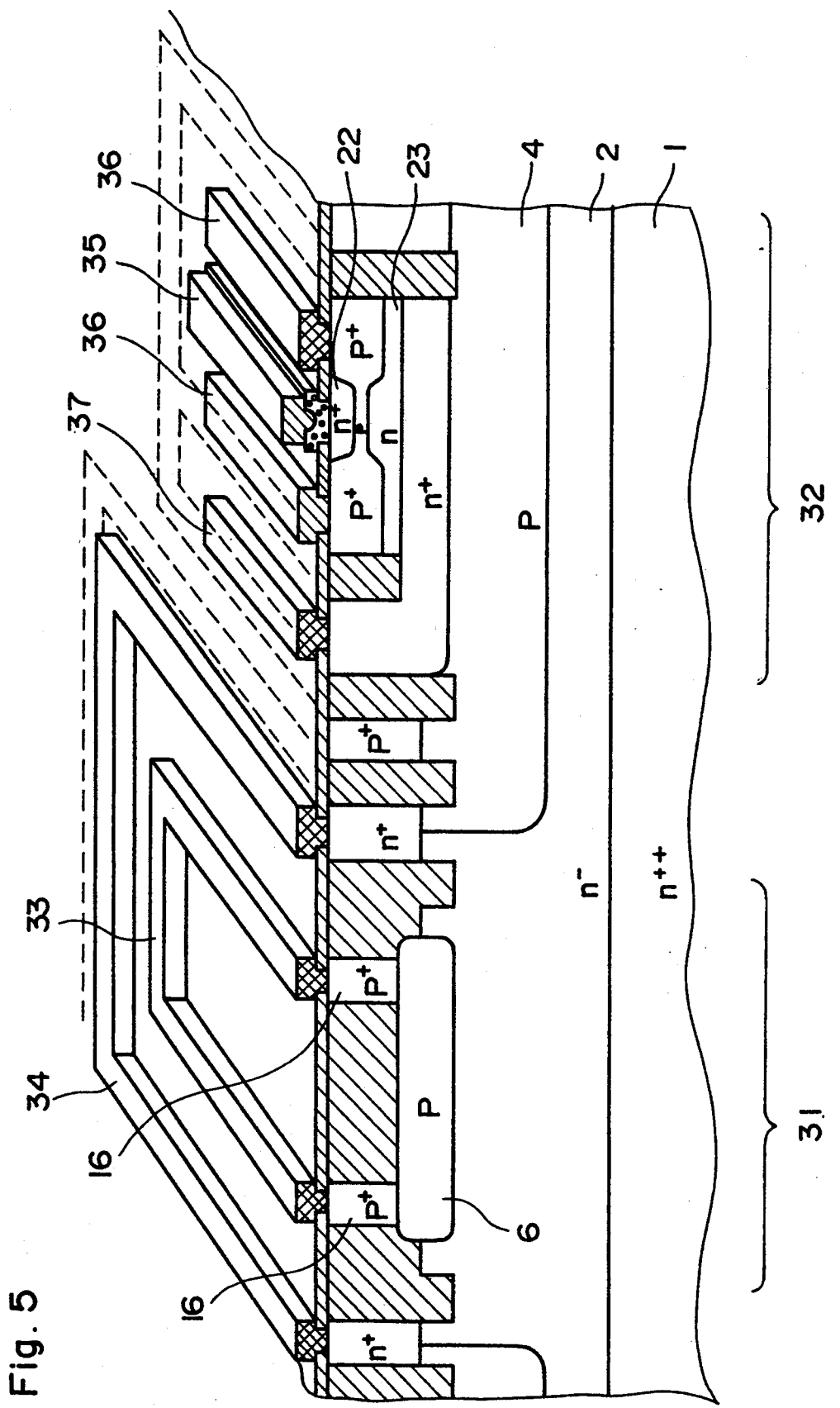
FIG. 5 is a perspective view of the monolithic IC according to further another embodiment of this invention.

The semiconductor device of FIG. 5 has followed the above-described steps and has the necessary electrodes formed. In this semiconductor, the PIN photodiode 31 and the npn transistor 32 are formed monolithically on the same substrate. The PIN photodiode 31 is a substrate-type PIN silicon photodiode having the heavily doped n-type silicon substrate 1 serving as the N layer, the lightly doped n-type epitaxial layer 2 serving as the I layer, and the p-type buried-layer 6 serving as the P layer.

Figure 7:
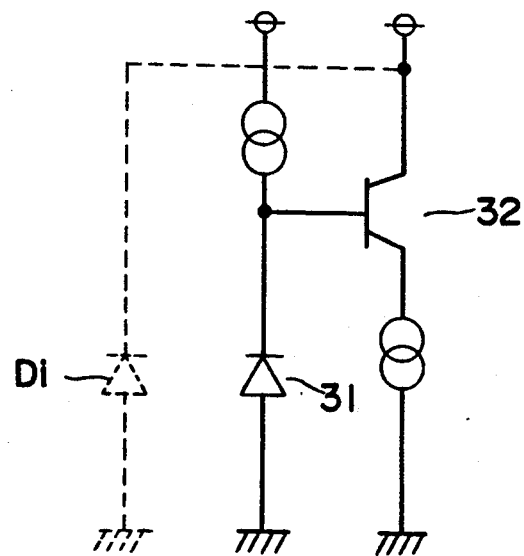
FIG. 7 is an equivalent circuit of the monolithic IC of FIG. 1.

The semiconductor device according to this embodiment produces the following remarkable advantageous effects. That is, in the embodiment of FIG. 1, in which the p−-type epitaxial layer is formed on the p+-type silicon substrate, and the n-type buried-layer is formed to thereby form the PIN photodiode and the npn transistor, the substrate is grounded, and its equivalent circuit is as shown in FIG. 7. In FIG. 7, $D_i$ represents a parasitic diode formed between a power source and an earth. As seen from FIG. 7, the earth of the npn transistor 32 and the cathode of the PIN photodiode 31 are common. The bias voltage of the PIN photodiode is restricted by the parasitic diode $D_i$ and cannot rise above the source voltage of the npn transistor.

Figure 8:
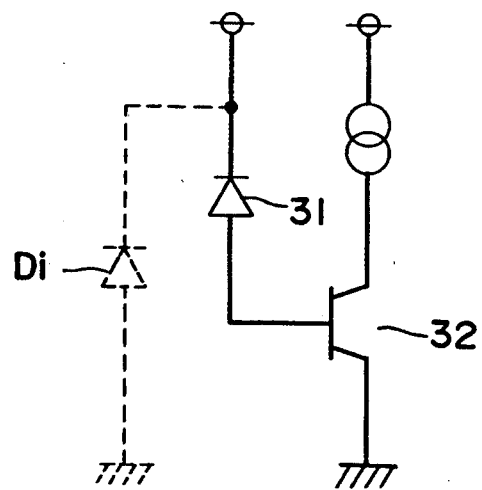
FIG. 8 is an equivalent circuit of the monolithic IC of FIG. 5.

But in the embodiment of FIG. 5 in which the substrate 1 is of n++-type, with the p-type well buried-layer 4 below the npn transistor 32 as the earth, the substrate 1 is connected to a power source. Accordingly, the PIN photodiode is reverse biased with respect to the earth of the npn transistor, and the bias voltage to the PIN photodiode 31 can be a higher voltage of the power source of the npn transistor. The equivalent circuit for this case is shown in FIG. 8. As seen from FIG. 8, the p-well buried layer 4 serving as the earth of the npn transistor, and the cathode 2 of the PIN photodiode (the n-type epitaxial layer) are isolated by pn junction, and the PIN photodiode is free from any biasing conditions. Accordingly the running speed of the PIN photodiode can be raised up to its saturated speed, and accordingly the performance speed of this semiconductor device can be improved.

Figure 9:
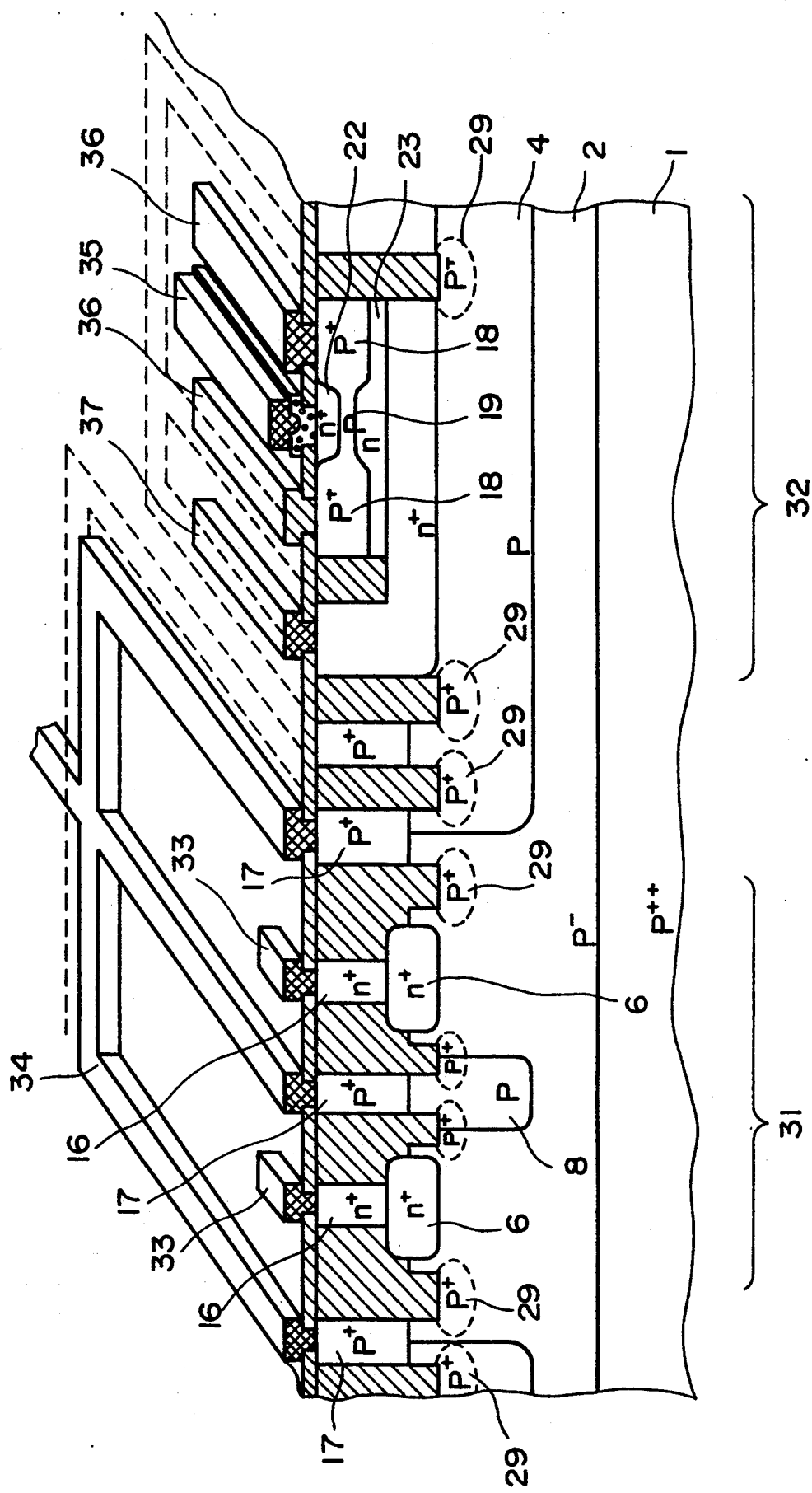
FIG. 9 is a perspective view of a section of the monolithic IC according to a different embodiment of this invention.

FIG. 9 shows the monolithic IC according to further embodiment. This embodiment is characterized by the PIN photodiode. The structure of this embodiment will be detailed below by the sequential explanation of its fabrication steps. In this PIN photodiode, in addition to a photocurrent flowing vertically from a p+-type substrate 1 to p-type epitaxial layer 2 and an n+-type buried layer 6, a photocurrent flows horizontally from a p+-type doped layer 17 to a p−-type epitaxial layer 2 and an n+-type buried-layer 6. Consequently parasitic resistance is greatly decreased.

For accurate understanding of the semiconductor device according to this embodiment, the initial part of the process for fabricating this embodiment will be explained with reference to FIGS. 10A to 10D.

Figure 10A:
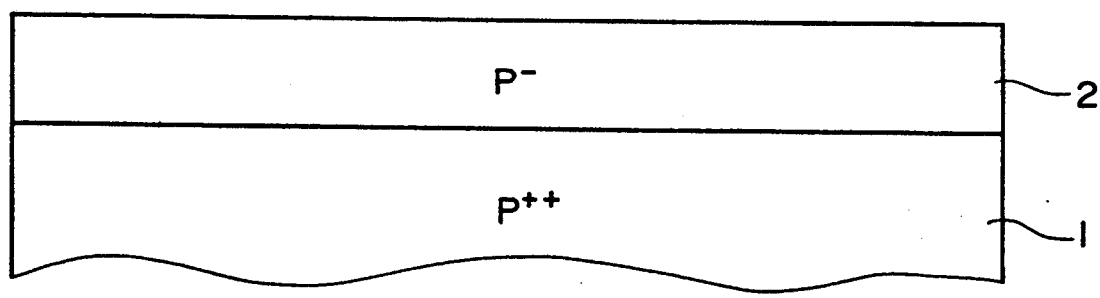
FIGS. 10A to 10D are sectional views of the process for fabricating the monolithic IC of FIG. 9.
Figure 10B:
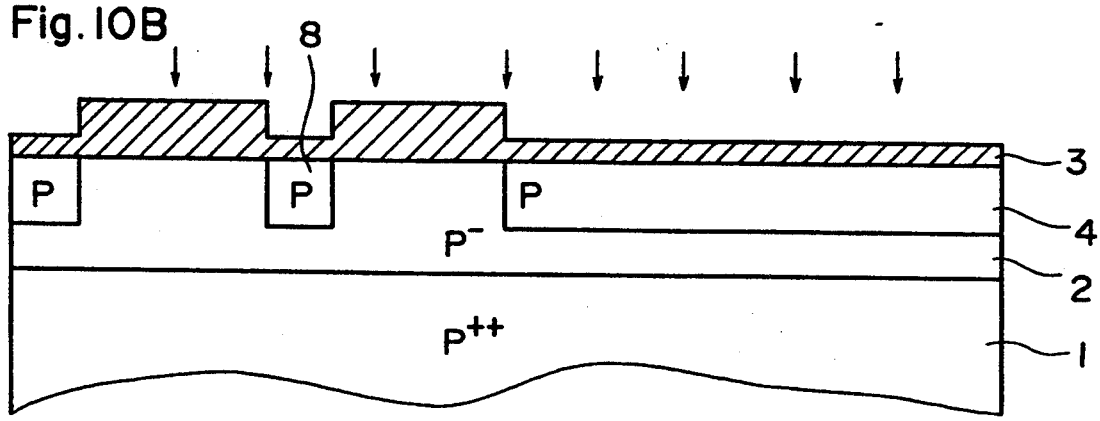
Figure 10:
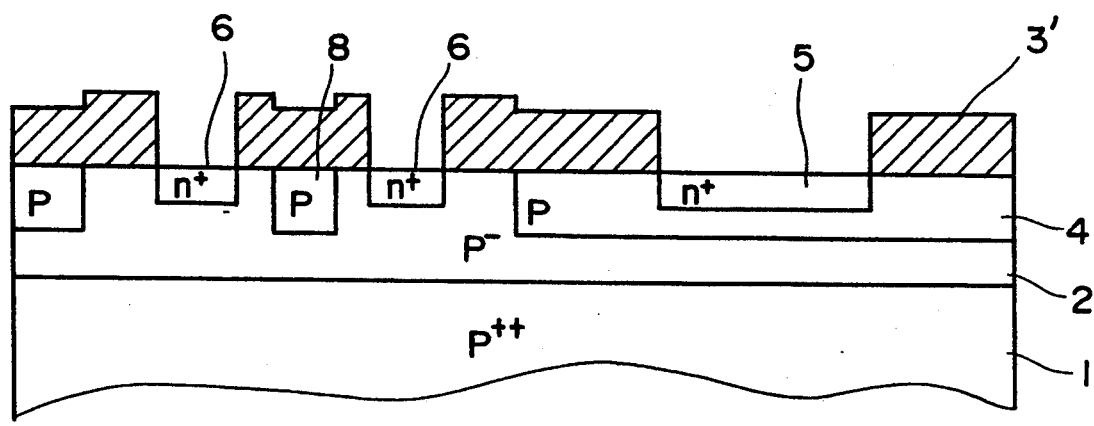
Figure 10:
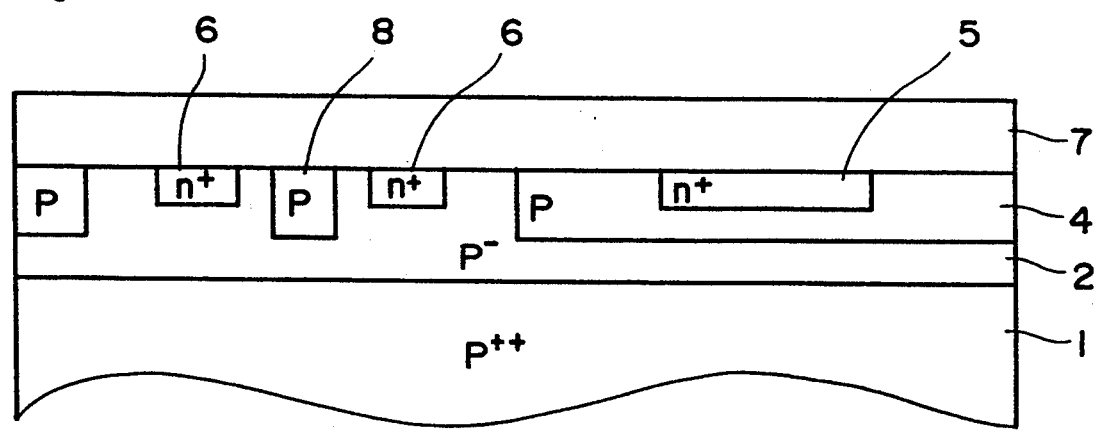

A lightly doped p-type epitaxial layer 2 with a dopant concentration of around $10^{12}$ to $10^{14}$ atoms/cm$^3$ is formed on a heavily doped silicon substrate with a dopant concentration of around $10^{20}$ to $10^{21}$ atoms/cm$^3$ in a thickness of 30 to 50 $\mu$m (FIG. 10A). Then SiO$_2$ is deposited on the surface anti processed. With the processed SiO$_2$ film 3 as the mask, boron ions are implanted from above to form a p-type well buried-layer 4 for the npn transistor, and a p-type buried-layer 8 for the anode region of the PIN photodiode. The dopant concentrations of the buried layers 4, 8 are around $10^{15}$ to $10^{16}$ atoms/cm$^3$ (FIG. 10B). Next again a SiO$_2$ film is formed on the surface and processed. With this processed SiO$_2$ film as the mask, antimony (Sb) is thermally diffused, whereby an n-type buried-layer 5 for the npn transistor, and an n-type buried-layer for the PIN photodiode are formed. The dopant concentrations of these n-type buried layers 5, 6 are $10^{19}$ to $10^{20}$ atoms/cm$^3$ (FIG. 10C) Subsequently the SiO$_2$ film is removed to form an epitaxial layer 7 in a thickness of 2 $\mu$m$\pm$0.2 $\mu$m which is for forming the npn transistor. The dopant concentration of the n-type epitaxial layer 7 is $10^{15}$ to $10^{16}$ atoms/cm$^3$ (FIG. 10D).

Thus the burying and diffusion process, and the epitaxial growth process have been completed.

Figure 11:
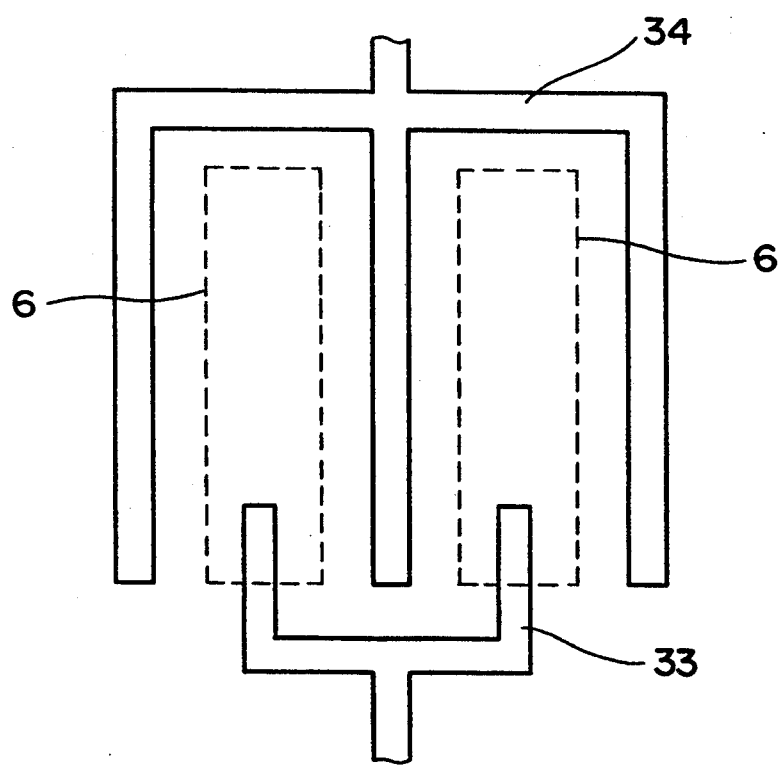
FIG. 11 is a plan view of the photodiode of FIG. 9.

Subsequently the isolation process and the npn transistor forming process will be followed to complete the semiconductor device of FIG. 9 according to this embodiment. As seen from the above explanation, in the semiconductor device according to this embodiment, two epitaxial layers are formed on the heavily doped p-type substrate 1 to thereby allow the PIN photodiode 31 and the npn transistor 32 to be formed monolithically on the same substrate. FIG. 11 shows a plan view of the PIN photodiode 31 involved in this embodiment.

The PIN photodiode 31 has the n-type buried-layer 6 serving as the N layer. The lightly doped p-type epitaxial layer 2 serving as the I layer, and the p-type doped layer 17 enclosing the n-type buried-layer 6 and the heavily doped p-type substrate 1 serving as the P layer. The n-type buried-layer 6 is divided in two regions. In the n-type buried-layer 6 there is provided a cathode 33 through an electrode layer 16. An anode not shown is provided on the underside of the substrate 1. An electrode 34 on the p-type doped layer 17 functions as the anode electrode of the PIN photodiode together with the electrode on the underside of the substrate.

When a beam is incident with a reverse bias voltage applied between the anode and the cathode, carriers are generated in the depletion region of the lightly doped p-type epitaxial layer 2 and move because of the electric field of the depletion region. In this embodiment, the electrode 34 is added as the anode to cause a photocurrent to flow transversely (horizontally), parasitic resistance can be decreased, compared with the case where the anode is provided only by the electrode on the underside of the substrate. In the PIN photodiode involved in this embodiment, the n-type buried-layer 6 as the N layer is divided in two regions, but by dividing the n-type buried-layer 6 in a larger number of regions and enclosing each region by a p-type doped layer, parasitic resistance can be further decreased. The plane arrangement of the n-type buried-layer 6 and the p-type doped layer 17 are not limited to that of this embodiment. For example, both may be arranged conically and alternately, and the layers of the same type may be connected by the wiring on the surface.

Figure 12:
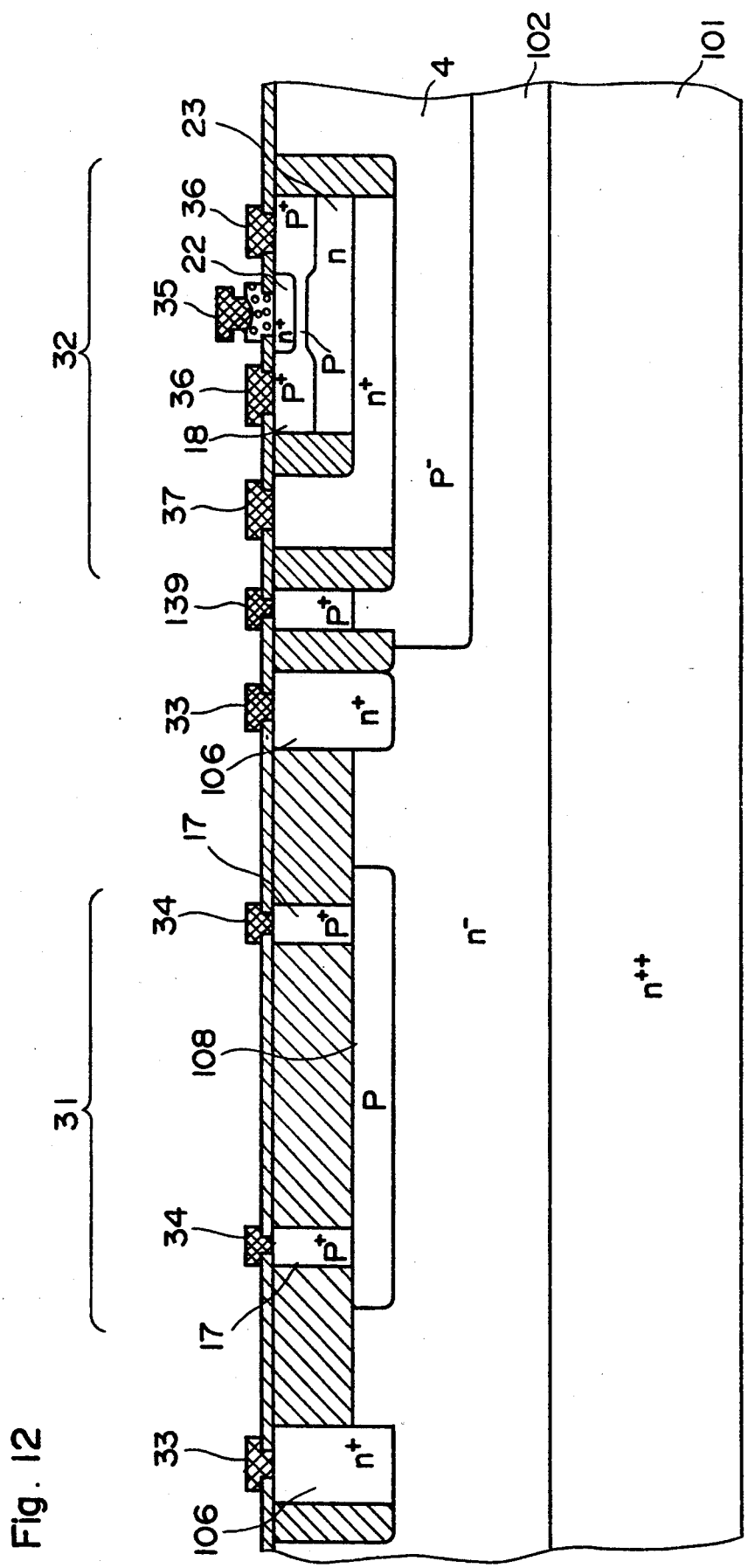
FIG. 12 is a sectional view of the monolithic IC according to another different embodiment of this invention.

FIG. 12 shows a sectional view of a different embodiment of this invention.

In this embodiment, the PIN photodiode 31 and the npn transistor 32 are integrated monolithically. The characteristic difference of this embodiment from the above-described embodiment is that the substrate and the epitaxial layer are of the opposite conductive type (n-type), and the PIN photodiode 31 and the npn transistor 32 are isolated by pn junction. That is, a lightly doped n-type epitaxial layer 102 is formed on a heavily doped n-type substrate 101, and a p-type buried-layer 4 directly below the npn transistor 32 and the lightly doped n-type epitaxial layer 102 are connected by pn junction. The PIN photodiode 31 has an n-type buried-layer/electrode layer 106 and the heavily doped n-type substrate 101 serving as the N layer, the lightly doped n-type epitaxial layer 102 serving as the I layer, and a p-type doped layer 17 and a p-type buried-layer 108 serving as the P layer. A cathode 33 is formed on the n-type buried layer/electrode layer 106, and an anode 34 is formed on the p-doped layer 17.

Although the heavily doped p-type semiconductor substrate i is grounded in the embodiment of FIG. 9, in the embodiment of FIG. 12 tire p-type buried layer 4 is grounded through an electrode 139, and a positive source voltage is applied to the heavily doped n-type substrate 101. Accordingly the pn junction between the p-type buried-layer 4 and the lightly doped epitaxial layer 102 is reverse biased, and the PIN photodiode 31 and the npn transistor 32 are isolated by pn junction. Consequently this produces the advantageous effect that the bias voltage of the PIN photodiode 31 can be increased.

Thus in the PIN photodiode of FIG. 9 or FIG. 12, a horizontal photocurrent flows with the p-(or n-)type buried-layer serving as the P layer (N layer) in addition to a vertical photocurrent with the heavily doped p-(or n-)type semiconductor substrate serving as the P layer (N layer). Consequently parasitic resistance can be greatly decreased. Consequently high speed performance becomes possible, which is useful to speed up the optical communication.

From the invention thus described, it will be obvious that the invention may be varied in many ways. Such variations are not; to be regarded as a departure from the spirit and scope of the invention, and all such modifications as would be obvious to one skilled in the art are intended to be included within the scope of the following claims.

We claim:

1. A semiconductor device comprising a heavily doped p-type semiconductor substrate, a lightly doped p-type epitaxial layer formed on the substrate, and an n-type epitaxial layer formed on the p-type epitaxial layer, a doped n-type layer formed in the surface of a predetermined region of the lightly doped p-type epitaxial layer, the heavily doped p-type semiconductor substrate serving as a P layer, the lightly doped p-type epitaxial layer serving as an I layer, and the doped n-type layer serving as an N layer of a PIN photodiode; and an electronically active element being formed in portion of the n-type epitaxial layer near said predetermined region.

2. A semiconductor device according to claim 1, wherein said electronically active element comprises an n-p-n bipolar transistor constituted by a p-type base layer and an n-type emitter layer formed by doping impurities in the n-type epitaxial layer, and an n-type collector layer provided by the n-type epitaxial layer per se.

3. A semiconductor device according to claim 1, wherein the heavily doped p-type semiconductor substrate, the lightly doped p-type epitaxial layer and the n-type epitaxial layer are formed of silicon; and
a part of the n-type epitaxial layer in said predetermined region is left as an electrode layer, and a silicon oxide film is formed by oxidizing the n-type epitaxial layer in substantially the same thickness as the electrode layer in at least the peripheral region of the electrode layer.

4. A semiconductor device comprising a heavily doped n-type semiconductor substrate, a lightly doped n-type epitaxial layer formed on the substrate, and another n-type epitaxial layer formed on the lightly doped n-type epitaxial layer,
a doped p-type layer formed in the surface of a predetermined region of the lightly doped n-type epitaxial layer, the heavily doped n-type semiconductor substrate serving as an N layer, the lightly doped n-type epitaxial layer serving as an I layer and the doped p-type layer serving as a P layer of a PIN photodiode; and
an electronically active element being formed in a portion of the another n-type epitaxial layer near said predetermined region.

5. A semiconductor device according to claim 4, wherein said electronically active element comprises an n-p-n bipolar transistor constituted by a p-type base layer and an n-type emitter layer formed by doping impurities in the another n-type epitaxial layer, and an n-type collector layer provided by the another n-type epitaxial layer per se.

6. A semiconductor device according to claim 5, wherein a p-well buried layer is formed below the n-p-n bipolar transistor, and a reverse bias voltage is applied between said p-well buried layer and a cathode of the PIN photodiode.

7. A semiconductor device comprising:
a heavily doped p-type semiconductor substrate;
a lightly doped p-type epitaxial layer formed on said substrate, said lightly doped p-type epitaxial layer having a first portion and a second portion;
an n-type epitaxial layer formed on said p-type epitaxial layer, said n-type epitaxial layer having a first portion and a second portion, said first portion of said n-type epitaxial layer being an n-type buried region;
an electrically active element formed in said second portion of said n-type epitaxial layer; and
a p-type layer more heavily doped than said lightly doped p-type epitaxial layer formed between said second portion of said lightly doped p-type layer and said electrically active element;
wherein a PIN photodiode is formed in said semiconductor device, said first portion of said lightly doped p-type epitaxial layer functioning as an I layer of the PIN photodiode and said first portion of said n-type epitaxial layer functioning as an N layer of the PIN photodiode.

8. A PIN photodiode comprising:
a heavily doped first conductive type semiconductor substrate which has an underside;
a lightly doped first conductive type epitaxial layer;
a second conductive type layer, having an entire periphery, formed in a surface of a predetermined region of said lightly doped first conductive type epitaxial layer;
an electrode layer formed of an n-type epitaxial layer and extending from said second conductive type layer to an upper surface of said PIN photodiode through an oxide layer formed on said second conductive type Layer by an oxidation process; and
a p-type doped layer surrounding said second conductive type layer in the peripheral thereof;
an anode of said PIN photodiode being provided by the underside of the heavily doped first conductive type semiconductor substrate, a cathode of said PIN photodiode being provided by said electrode layer, and an I layer of said PIN photodiode being provided by the lightly doped first conductive type epitaxial layer.

9. A PIN photodiode according to claim 8, wherein said second conductive type layer is n-type, the p-type doped layer provides an anode together with the underside of the heavily doped first conductive type semiconductor substrate, said second conductive type layer and said p-type doped layer are formed, respectively, in plural numbers in said PIN photodiode, and said second conductive layers are connected to each other by wiring and said p-type doped-layers are connected to each other by wiring.

* * * * *